US012676122B2

(12) United States Patent
Kim

(10) Patent No.: US 12,676,122 B2
(45) Date of Patent: Jul. 7, 2026

(54) DISPLAY APPARATUS

(71) Applicant: LG DISPLAY CO., LTD., Seoul (KR)

(72) Inventor: Jaewoo Kim, Gimpo-si (KR)

(73) Assignee: LG Display Co., Ltd. (KR)

( * ) Notice: Subject to any disclaimer, the term of this patent is extended or adjusted under 35 U.S.C. 154(b) by 0 days.

(21) Appl. No.: 19/237,232

(22) Filed: Jun. 13, 2025

(65) Prior Publication Data

US 2025/0308466 A1      Oct. 2, 2025

Related U.S. Application Data

(63) Continuation of application No. 18/658,050, filed on May 8, 2024, now Pat. No. 12,361,896.

(30) Foreign Application Priority Data

Sep. 15, 2023      (KR) ......................... 10-2023-0123509

(51) Int. Cl.
| | |
|---|---|
| *G09G 3/32* | (2016.01) |
| *G09G 3/3266* | (2016.01) |
| *H10K 59/131* | (2023.01) |
| *H10K 77/10* | (2023.01) |

(52) U.S. Cl.
CPC ......... *G09G 3/3266* (2013.01); *H10K 59/131* (2023.02); *H10K 77/111* (2023.02)

(58) Field of Classification Search
CPC .... G09G 3/3266; G09G 3/3208; G09G 3/006; G09G 2300/0426; G09G 2300/0809; G09G 2330/021; H10K 59/131; H10K 77/111; H10K 2102/311; H10K 59/1213; H10K 59/124; H10K 59/873
See application file for complete search history.

(56) References Cited

U.S. PATENT DOCUMENTS

| | | | | |
|---|---|---|---|---|
| 2018/0337223 | A1* | 11/2018 | Lee ...................... | H10D 86/443 |
| 2022/0344448 | A1* | 10/2022 | Zhang .................. | H10K 59/122 |
| 2024/0172490 | A1* | 5/2024 | Huang ................. | H10K 59/124 |
| 2024/0237449 | A1* | 7/2024 | Gao ................... | H10K 59/1315 |

* cited by examiner

*Primary Examiner* — Pegeman Karimi
(74) *Attorney, Agent, or Firm* — Fish & Richardson P.C.

(57) ABSTRACT

A display apparatus includes a substrate including an active area and a non-active area including a bending area and a pad area; a gate driver disposed in the non-active area; a driving integrated circuit disposed in the pad area; a plurality of signal lines disposed in the bending area and connecting the driving integrated circuit and the gate driver; and at least one protection line disposed at an end in a width direction of the bending area, wherein one end of the at least one protection line is connected to the driving integrated circuit.

16 Claims, 12 Drawing Sheets

DISPLAY APPARATUS

CROSS-REFERENCE TO RELATED APPLICATION

This application is a continuation of U.S. patent application Ser. No. 18/658,050, filed on May 8, 2024, which claims the priority of Korean Patent Application No. 10-2023-0123509 filed on Sep. 15, 2023, which is hereby incorporated by reference in its entirety.

BACKGROUND

Field of the Disclosure

The present disclosure relates to a display apparatus.

Description of the Background

As it enters the information era, a field of a display apparatus which visually expresses electrical information signals has been rapidly developed and studies are continued to improve performances of various display apparatuses, such as a thin-thickness, a light weight, and low power consumption.

Among various display apparatuses, a light emitting display apparatus is a self-emitting display apparatus so that a separate light source is not necessary. Therefore, the light emitting display apparatus may be manufactured to have a light weight and a small thickness. Since the light emitting display apparatus is driven at a low voltage so that it is advantageous not only in terms of power consumption, but also in terms of color implementation, a response speed, a viewing angle, a contrast ratio (CR). Therefore, it is expected to be utilized in various fields.

SUMMARY

The present disclosure is to provide a display apparatus which suppresses cracks generated in a wiring line disposed in a bending area.

The present disclosure is also to provide a display apparatus which senses a crack which is generated in a wiring line disposed in a bending area.

The present disclosure is not limited to the above-mentioned and other features, which are not mentioned above, may be clearly understood by those skilled in the art from the following descriptions.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

To achieve these and other advantages and in accordance with the present disclosure, as embodied and broadly described, a display apparatus includes a substrate including an active area and a non-active area including a bending area and a pad area; a gate driver disposed in the non-active area; a driving integrated circuit disposed in the pad area; a plurality of signal lines disposed in the bending area and connecting the driving integrated circuit and the gate driver; and at least one protection line disposed at an end in a width direction of the bending area, wherein one end of the at least one protection line is connected to the driving integrated circuit.

In another aspect of the present disclosure, a display apparatus includes a substrate including an active area and a non-active area including a bending area and a pad area; a gate driver disposed in the non-active area; a driving integrated circuit disposed in the pad area; a plurality of signal lines disposed in the bending area and connecting the driving integrated circuit and the gate driver with each other; and at least one protection line disposed outside the plurality of signal lines in the bending area, wherein the at least one protection line is supplied with a voltage lower than a voltage supplied with the plurality of signal lines.

In a further aspect of the present disclosure, a display apparatus includes a substrate including an active area and a non-active area including a bending area and a pad area; a gate driver disposed in the non-active area; a driving integrated circuit disposed in the pad area; a plurality of signal lines disposed in the bending area and connecting the driving integrated circuit and the gate driver with each other; and first, second and third protection lines extended from the padding area to the bending area and disposed to an edge of the substrate closer than the plurality of signal lines in the bending area, wherein the first, second and third protection lines have different lengths, and wherein the at least one protection line is supplied with a voltage lower than a voltage supplied with the plurality of signal lines.

In the display apparatus according to an exemplary aspect of the present disclosure, one end of at least one protection line may be connected to the driving integrated circuit.

Other detailed matters of the exemplary aspects are included in the detailed description and the drawings.

According to an exemplary aspect of the present disclosure, a crack suppression line is applied to a display apparatus to provide a low power display apparatus with an improved reliability.

According to an exemplary aspect of the present disclosure, a wiring line which detects a crack is applied to a non-active area of the display apparatus to sense a defect in advance so that a display apparatus which is robust to the reliability may be provided.

The effects of the present disclosure are not limited to the aforementioned effects, and other effects, which are not mentioned above, will be apparently understood to a person having ordinary skill in the art from the following description.

It is to be understood that both the foregoing general description and the following detailed description are exemplary and explanatory and are intended to provide further explanation of the disclosure as claimed.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
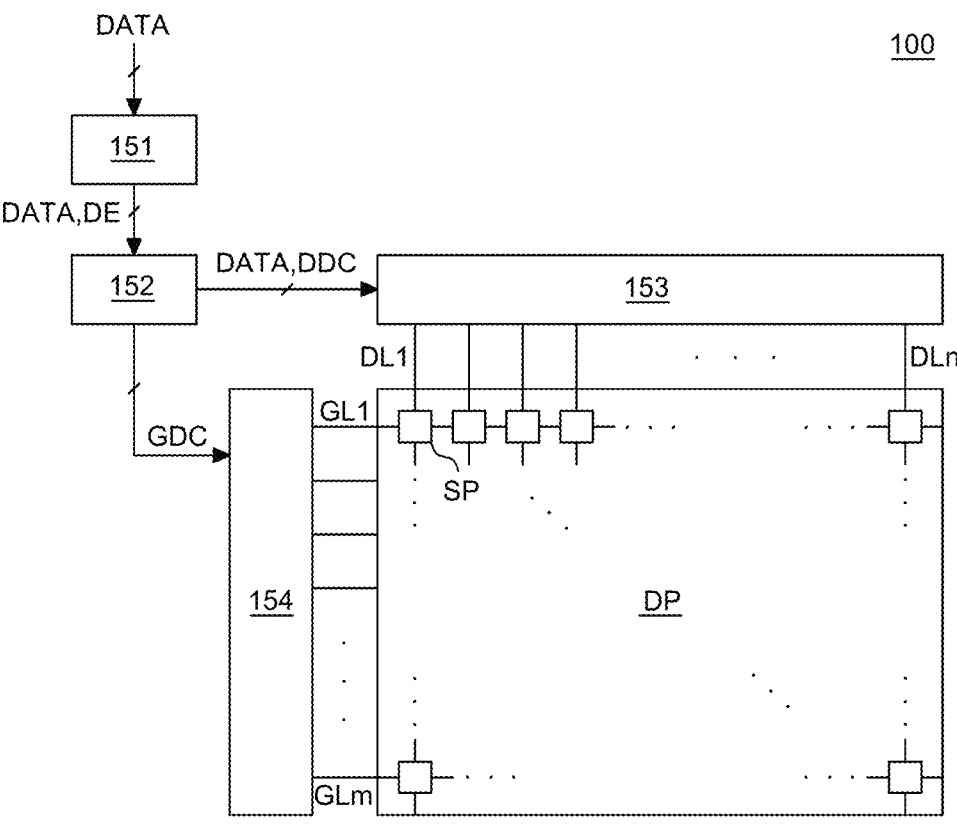
FIG. 1 is a view of a display apparatus according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art may fully understand the disclosures of the present disclosure and the scope of the present disclosure.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When the relation of a time sequential order is described using the terms such as "after", "continuously to", "next to", and "before", the order may not be continuous unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

In describing components of the exemplary aspect of the present disclosure, terminologies such as first, second, A, B, (a), (b), and the like may be used. These terminologies are used to distinguish a component from the other component, but a nature, an order, or the number of the components is not limited by the terminology. When a component is "linked", "coupled", or "connected" to another component, the component may be directly linked or connected to the other component. However, unless specifically stated otherwise, it should be understood that a third component may be interposed between the components which may be indirectly linked or connected.

It should be understood that "at least one" includes all combinations of one or more of associated components. For example, "at least one of first, second, and third components" means that not only a first, second, or third component, but also all combinations of two or more of first, second, and third components are included.

In the present specification, a "display apparatus" may include a display apparatus which includes a display panel and a driver for driving the display panel, in a narrow sense, such as a liquid crystal module (LCM), an organic light emitting diode module (OLED module), and a quantum dot module. Further, the "display apparatus" may further include a set electronic apparatus or a set apparatus (or a set device) which is a complete product or a final product including an LCM, an OLED module, a QD module, etc., such as a notebook computer, a television, or a computer monitor, an automotive display apparatus or equipment display apparatus including another type of vehicle and a mobile electronic apparatus including a smart phone or an electronic pad.

Accordingly, the display apparatus of the present disclosure may include not only a display apparatus itself in a narrow sense such as an LCM, an OLED module, a QD module, etc., but also an applied product or a set apparatus which is a final consumer device including the LCD, the OLED module, the QD module, etc.

Further, in some cases, the LCM, the OLED module, or the QD module which is configured by a display panel and a driver may be represented as "a display apparatus" in a narrow sense and an electronic device as a complete product including the LCM, the OLED module, and the QD module may be represented as a "set apparatus". For example, the display apparatus in the narrow sense includes a liquid crystal (LCD) display panel, an OLED display panel, or a quantum dot display panel and a source PCB which is a controller for driving the display panel. In contrast, the set apparatus may be a concept further including a set PCB which is a set controller which is electrically connected to the source PCB to control the entire set apparatus.

As a display panel used in the exemplary aspect of the present disclosure, any type of display panel such as a liquid crystal display panel, an organic light emitting diode (OLED) display panel, a quantum dot (QD) display panel, and an electroluminescent display panel may be used. The display panel of the present exemplary aspect is not limited to a specific display panel in which a bezel is bent with a flexible substrate for the organic light emitting diode (OLED) display panel and a back plate support structure therebelow. Further, a display panel used for the display apparatus according to the exemplary aspect of the present disclosure is not limited to a shape or a size of the display panel.

For example, when the display panel is an OLED display panel, the display panel may include a plurality of gate lines, data lines, and pixels formed at intersecting areas of the gate lines and/or data lines. Further, the display panel may be configured to include an array including a thin film transistor which is an element to selectively apply a voltage to each pixel, a light emitting diode layer on the array, an encapsulation substrate or an encapsulation layer, and the like disposed on the array to cover the light emitting diode layer. The encapsulation layer may protect the thin film transistor, the light emitting diode layer, and the like from external impacts and may suppress the permeation of moisture or oxygen into the light emitting diode layer. Further, a layer formed on the array may include an inorganic light emitting layer, for example, a nano-sized material layer, quantum dots, or the like.

The features of various exemplary aspects of the present disclosure may be partially or entirely coupled to or combined with each other and may be interlocked and operated in technically various ways, and the exemplary aspects may be carried out independently of or in association with each other.

Hereinafter, the exemplary aspect of the present disclosure will be described with reference to the accompanying drawings and exemplary aspects as follows. Scales of components illustrated in the accompanying drawings are different from the real scales for the purpose of description, so that the scales are not limited to those illustrated in the drawings.

Hereinafter, an exemplary aspect of the present disclosure will be described in detail with reference to the drawings.

FIG. 1 is a block diagram of a display apparatus according to an exemplary aspect of the present disclosure.

Referring to FIG. 1, a display apparatus 100 according to an exemplary aspect of the present disclosure may include an image processor 151, a timing controller 152, a data driver 153, a gate driver 154, and a display panel DP.

At this time, the image processor 151 may output a data signal DATA supplied from the outside, a data enable signal DE, and the like. The image processor 151 may output one or more of a vertical synchronization signal, a horizontal synchronization signal, and a clock signal in addition to the data enable signal DE.

The timing controller 152 is supplied with the data signal DATA together with a driving signal including the data enable signal DE or the vertical synchronization signal, the horizontal synchronization signal, the clock signal, and the like, from the image processor 151. The timing controller 152 may output a gate timing control signal GDC for controlling an operation timing of the gate driver 154 and a data timing control signal DDC for controlling an operation timing of the data driver 153, based on the driving signal.

For example, the data driver 153 samples and latches the data signal DATA supplied from the timing controller 152 in response to the data timing control signal DDC supplied from the timing controller 152 to convert the data signal into a gamma reference voltage and output the converted gamma reference voltage. The data driver 153 may output the data signal DATA through data lines DL1 to DLn.

For example, the gate driver 154 may output the gate signal while shifting a level of the gate voltage, in response to the gate timing control signal GDC supplied from the timing controller 152. The gate driver 154 may output the gate signal through gate lines GL1 to GLm.

The display panel DP may display images while a sub pixel SP emits light in response to the data signal DATA and the gate signal supplied from the data driver 153 and the gate driver 154. A detailed structure of the sub pixel SP will be described in detail with reference to FIGS. 2 and 4.

Figure 2:
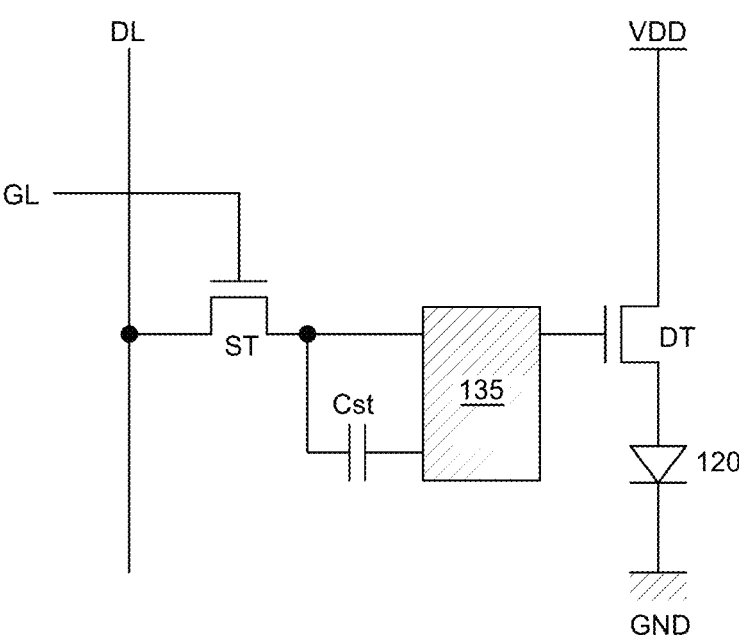
FIG. 2 is a circuit diagram of a display apparatus according to an exemplary aspect of the present disclosure.

FIG. 2 is a circuit diagram of a sub pixel of a display apparatus according to an exemplary aspect of the present disclosure.

Referring to FIG. 2, the sub pixel of the display apparatus 100 according to the exemplary aspect of the present disclosure may include a switching transistor ST, a driving transistor DT, a compensation circuit 135, and a light emitting diode 120.

The light emitting diode 120 may operate to emit light in accordance with a driving current formed by the driving transistor DT.

The switching transistor ST may perform a switching operation such that a data signal supplied through the data line DL is stored in a capacitor Cst as a data voltage in response to a gate signal supplied through the gate line GL.

The driving transistor DT may operate to flow a constant driving current between a high potential power line VDD and a low potential power line GND in response to a data voltage stored in the capacitor Cst.

The compensation circuit 135 is a circuit for compensating for a threshold voltage, etc. of the driving transistor DT and may include one or more thin film transistors and capacitors. A configuration of the compensation circuit 135 may vary depending on a compensating method.

The sub pixel illustrated in FIG. 2 is configured by a 2T (transistor) 1C (capacitor) structure including a switching transistor ST, a driving transistor DT, a capacitor Cst, and a light emitting diode 120. When the compensation circuit 135 is added, the sub pixel may be configured in various forms, such as 3T1C, 4T2C, 5T2C, 6T1C, 6T2C, 7T1C, and 7T2C.

Figure 3:
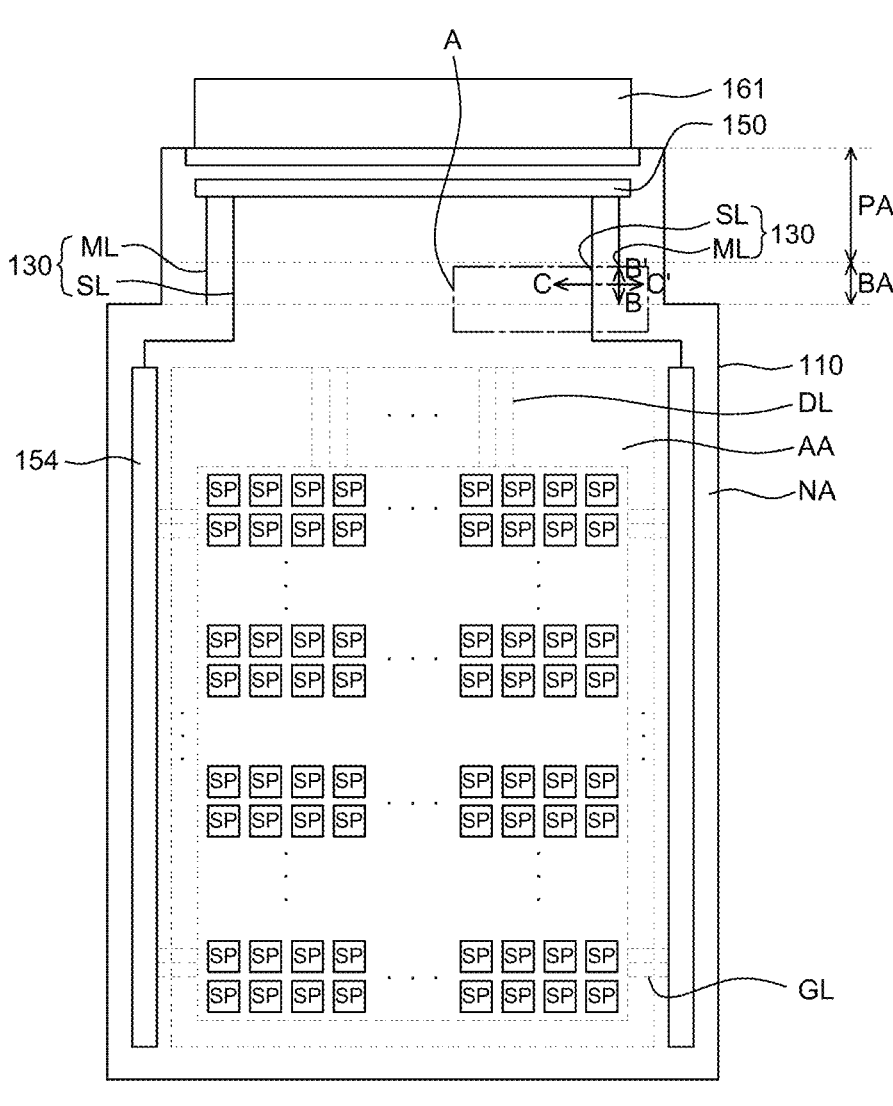
FIG. 3 is a plan view of a display apparatus according to an exemplary aspect of the present disclosure.

FIG. 3 is a plan view of a display apparatus according to an exemplary aspect of the present disclosure.

FIG. 3 illustrates a state in which a substrate 110 of the display apparatus 100 according to the exemplary aspect of the present disclosure is not bent as an example.

In FIG. 3, among various components of the display apparatus 100, only a substrate 110, a gate driver 154, a circuit element 161, and a plurality of wiring lines 130 are illustrated for the purpose of the convenience of description.

The substrate 110 is a component for supporting various components included in the display apparatus 100 and may be formed of an insulating material. The substrate 110 may be formed of a flexible material which is bendable. The substrate 110 may be formed of a transparent insulating material. For example, the substrate 110 may be formed of a plastic material such as polyimide (PI).

A plurality of gate lines GL and a plurality of data lines DL are disposed on the substrate 110 to intersect with each other. A plurality of sub pixels SP may be defined at the intersections of the plurality of gate lines GL and the plurality of data lines DL. An area in which a plurality of sub pixels SP implementing images is disposed may be referred to as an active area AA and an area disposed at the outside of the active area AA in which the plurality of sub pixels SP is not disposed may be referred to as a non-active area NA.

Each sub pixel SP includes sub pixels with different colors to implement various colors. Sub pixels include a red sub pixel, a green sub pixel, and a blue sub pixel. Each sub pixel SP may further include a white sub pixel. Hereinafter, when the pixel is not separately defined, the pixel may be interpreted as a sub pixel. Each sub pixel may include a pixel circuit.

In the active area AA, a display unit for displaying images and a circuit unit for driving the display unit may be disposed. For example, when the display apparatus 100 is an organic light emitting display apparatus, the display unit may include a light emitting diode. That is, the display unit may include an anode, an organic light emitting layer on the anode, and a cathode on the organic light emitting layer. For example, the organic light emitting layer may be configured by a hole transport layer, a hole injection layer, an organic light emitting layer, an electron injection layer, and an electron transport layer. However, when the display apparatus 100 is a liquid crystal display apparatus, the display unit may be configured to include a liquid crystal layer.

Hereinafter, for the convenience of description, it is assumed that the display apparatus 100 is an organic light emitting display apparatus but is not limited thereto.

The circuit unit may include various transistors, capacitors, and wiring lines for driving the light emitting diode. For example, the circuit unit may be configured by various components such as a driving transistor, a switching transistor, a storage capacitor, a gate line, and a data line, but is not limited thereto.

The non-active area NA is an area where no image is displayed and a circuit, such as the gate driver 154 for driving the display unit disposed in the active area AA and various wiring lines may be disposed in the non-active area.

The non-active area NA may be defined as an area which encloses the active area AA as illustrated in FIG. 3, but it is not limited thereto, and the non-active area NA may be defined as an area extending from the active area AA. Further, the non-active area NA may be defined to extend from a plurality of sides of the active area AA.

The non-active area NA may include a pad area PA.

The pad area PA may be formed to receive a data driving signal from an external power source or send and receive a touch signal to and from the external power source.

A driving integrated circuit DIC 150 may be disposed in the pad area.

For example, in the pad area PA, the circuit element 161 which is disposed in an outer area direction of the substrate 110 more than the driving integrated circuit 150 may be bonded.

For example, the circuit element 161 may be a flexible printed circuit but is not limited thereto.

The driving integrated circuit 150 disposed in the pad area PA may be connected to the plurality of signal lines SL and may be connected to the plurality of data lines DL or the plurality of gate lines GL disposed in the active area AA via the gate driver 154 through the plurality of signal lines SL. Therefore, the driving signal from the driving integrated circuit 150 disposed in the pad area PA may be applied to each of the plurality of sub pixels SP.

In the meantime, a plurality of protection lines ML disposed at the outside of the bending area BA may be included in a width direction of the bending area BA, in the bending area BA of the non-active area NA. The plurality of protection lines ML may be disposed to be closer to an end of a width of the bending area BA than the plurality of signal lines SL. For example, one end of at least one protection line ML is connected to the driving integrated circuit 150 to be applied with a signal which is relatively equal to or lower than a lowest voltage of the signal line SL. For example, a signal of a low voltage which is relatively equal to or lower than the low voltage line VGL or a negative (−) voltage may be applied to at least one protection line ML.

A plurality of wiring lines 130 including the plurality of signal lines SL and the plurality of protection lines ML will be described below with reference to FIG. 5.

For example, a bending area BA which is formed by bending a part of the non-active area NA in one direction may be located between the active area AA and the pad area PA in the non-active area NA.

The non-active area NA is not an area where the images are displayed so that the non-active area may not be visible from a top surface of the substrate 110. For example, a partial area of the non-active area NA of the substrate 110 is bent to reduce the non-active area NA while ensuring an area for the wiring lines and the driving circuit.

For example, the display apparatus 100 according to the exemplary aspect of the present disclosure may be bent in a rear direction so that a lower edge of the substrate 110 has a predetermined curvature.

The lower edge of the substrate 110 may correspond to an outside of the active area AA and may correspond to an area where the driving integrated circuit 150 and the pad area PA are located. As the substrate 110 is bent, the driving integrated circuit 150 and the pad area PA may be located to overlap the active area AA in a rear direction of the active area AA. Accordingly, the bezel area which is perceived from the front surface of the display apparatus 100 may be minimized. Therefore, the bezel width is reduced so that the aesthetics may be improved.

Hereinafter, a cross-sectional structure of the display apparatus 100 will be described in more detail with reference to FIG. 4 together.

Figure 4:
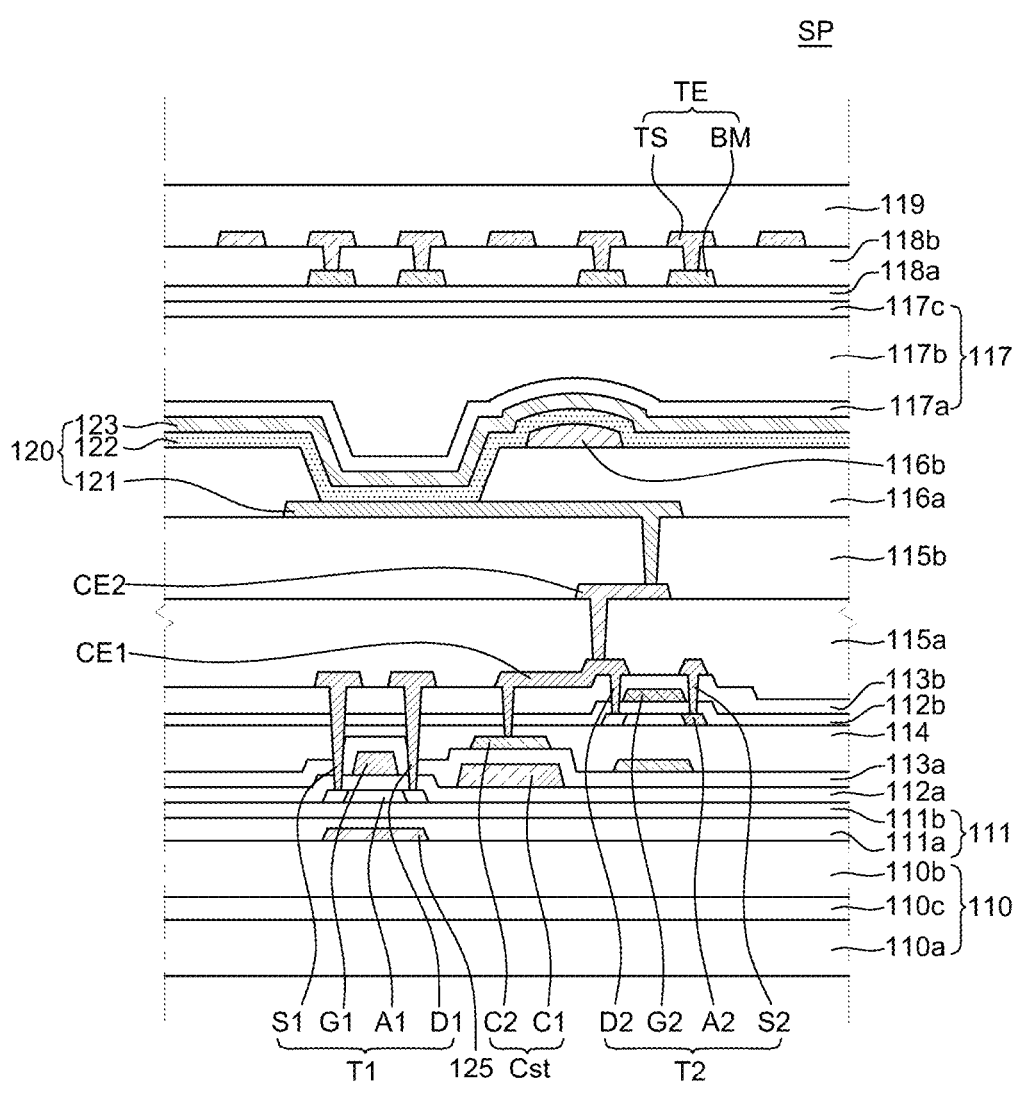
FIG. 4 is a cross-sectional view of one pixel disposed in an active area of a display apparatus according to an exemplary aspect of the present disclosure.

FIG. 4 is a cross-sectional view of one sub pixel SP disposed in an active area of a display apparatus according to an exemplary aspect of the present disclosure.

Referring to FIG. 4, a display apparatus 100 according to an exemplary aspect of the present disclosure may include a substrate 110, a first buffer layer 111, a first thin film transistor T1, a second thin film transistor T2, a first gate insulating layer 112a, a first insulating layer 113a, a first buffer layer 114, a second gate insulating layer 112b, a second insulating layer 113b, a first connection electrode CE1, a first planarization layer 115a, a second planarization layer 115b, a second connection electrode CE2, a bank 116a, a spacer 116b, a first electrode 121, a light emitting layer 122, a second electrode 123, an encapsulation layer 117, and a touch sensing unit.

The substrate 110 serves to support and protect components of a flexible display apparatus disposed thereabove.

The substrate 110 may be formed of glass or a plastic material having flexibility. When the substrate 110 is formed of a plastic material, for example, the substrate may be formed of polyimide (PI). When the substrate 110 is formed of polyimide (PI), the manufacturing process of the display apparatus 100 is performed under a circumstance when a support substrate formed of glass is disposed below the substrate 110 and the support substrate may be released after completing the manufacturing process of the display apparatus 100. Further, after releasing the support substrate, a back plate which supports the substrate 110 may be disposed below the substrate 110.

For example, when the back plate is further disposed below the substrate 110, the back plate may not be disposed in a part overlapping the bending area BA of the substrate 110 but is not limited thereto.

When the substrate 110 is formed of polyimide (PI), moisture passes through the substrate 110 formed of polyimide (PI) to permeate the first thin film transistor 120 or the emission structure so that the performance of the display apparatus 100 may deteriorate. The display apparatus 100 according to the exemplary aspect of the present disclosure may be configured by a double polyimide (PI) to suppress the deterioration of the performance of the display apparatus 100 due to the moisture permeation. Further, an inorganic layer is formed between the double polyimides (PI) to block the moisture components from permeating the lower polyimide (PI), so that the reliability of the product performance may be improved.

Further, in the display apparatus 100 according to the exemplary aspect of the present disclosure, an inorganic layer is formed between the double polyimides (PI) so that charges charged in lower polyimide (PI) are blocked, thereby improving the reliability of the product. Further, a process of forming a metal layer to block the charges charged in polyimide (PI) may be omitted, so that the process may be simplified, and the production cost may be reduced.

The display apparatus 100 uses polyimide (PI) as a substrate 110 to ensure an environmental reliability performance and a performance reliability of the panel.

Accordingly, the display apparatus 100 according to the exemplary aspect of the present disclosure uses double polyimide (PI) as a substrate 110 so that a structure for ensuring the environmental reliability of the product may be implemented. For example, the substrate 110 of the display apparatus 100 may include a first polyimide layer 110a and a second polyimide layer 110b formed of polyimide (PI) and an inorganic insulating layer 110c formed between the first polyimide layer 110a and the second polyimide layer 110b but is not limited thereto. When the charges are charged in the first polyimide layer 110a, the inorganic insulating layer 110c may serve to block the charges from affecting the first thin film transistor T1 through the second polyimide layer 110b. Further, the inorganic insulating layer 110c may also serve to block the moisture component from passing through the second polyimide layer 110b to permeate an upper portion.

The inorganic insulating layer 110c may be formed by a single layer of silicon nitride (SiNx) or silicon oxide (SiOx) or a multi-layer thereof. In the display apparatus 100 according to the exemplary aspect of the present disclosure, the inorganic insulating layer 110c may be formed of a silicon oxide (SiOx) material. For example, silica (or silicon dioxide (SiO2)) material may be formed as the inorganic insulating layer 110c but is not limited thereto and the inorganic insulating layer 110c may be formed by a double layer of silicon dioxide (SiO2) and silicon nitride (SiNx).

The first buffer layer 111 may be disposed on the substrate 110. Specifically, a multi-buffer layer 111a may be disposed on the substrate 110 and an active buffer layer 111b may be disposed on the multi-buffer layer 111a.

A metal layer 125 may be disposed on the multi-buffer layer 111a.

For example, the metal layer 125 may serve as a light shield and may also be referred to as a light shielding layer.

An active buffer layer 111b may be disposed on the metal layer 125.

The first thin film transistor T1 may be disposed on the first buffer layer 111. The first thin film transistor T1 may include a first active layer A1, a first gate electrode G1, a first source electrode S1, and a first drain electrode D1. Here, depending on the design of the pixel circuit, the first source electrode S1 may serve as a first drain electrode and the first drain electrode D1 may serve as a first source electrode.

The first active layer A1 may include amorphous silicon or polycrystalline silicon. For example, the first active layer A1 may include a low-temperature polycrystalline silicon LTPS. For example, the polycrystalline silicon material has a high mobility (100 cm²/Vs or higher) so that energy power consumption is low, and reliability is excellent. Therefore, the polycrystalline silicon material may be applied to a gate driver for driving elements which drive thin film transistors for a display element and/or a multiplexer (MUX), etc. and also applied as an active layer A1 of a driving thin film transistor of the display apparatus 100 according to the exemplary aspect but is not limited thereto. For example, the polycrystalline silicon material may also be applied as the active layer A2 of the switching thin film transistor according to the characteristic of the display apparatus 100. An amorphous silicon (a-Si) material is deposited on the first buffer layer 111 and a dehydrogenation process and a crystallization process are performed to form polycrystalline silicon and the polycrystalline silicon is patterned to form the first active layer A1. Here, the first active layer A1 may include a first channel region in which a channel is formed when the first thin film transistor T1 is driven and a first source region and a first drain region on both sides of the first channel region. The first source region refers to a part of the first active layer A1 which is connected to the first source electrode S1 and the first drain region refers to a part of the first active layer A1 which is connected to the first drain electrode D1. For example, the first source region and the first drain region are configured by ion-doping (or impurity doping) of the first active layer A1. The first source region and the first drain region may be generated by doping ions into the polycrystalline silicon material and the first channel region may refer to a part in which the ions are not doped, but the polycrystalline silicon material remains.

A first gate insulating layer 112a may be disposed on the first active layer A1. The first gate insulating layer 112a may be configured by a single layer of silicon nitride (SiNx) or silicon oxide (SiOx) or a multi-layer thereof. In the first gate insulating layer 112a, a contact hole through which the first source electrode S1 and the first drain electrode D1 of the first thin film transistor T1 are connected to the first source region and the first drain region of the first active layer A1 of the first thin film transistor T1, respectively, may be formed.

The first gate electrode G1 of the first thin film transistor T1 and a first capacitor electrode C1 of the storage capacitor Cst may be disposed on the first gate insulating layer 112a.

At this time, the first gate electrode G1 and the first capacitor electrode C1 may be formed by a single layer, or a multi-layer formed of one of molybdenum (Mo), copper (Cu), titanium (Ti), aluminum (Al), chrome (Cr), gold (Au), nickel (Ni), and neodymium (Nd) or an alloy thereof. The first gate electrode G1 may be formed on the first gate insulating layer 112a to overlap the first channel region of the first active layer A1 of the first thin film transistor T1.

The first capacitor electrode C1 may be omitted based on a driving characteristic of the display apparatus 100 and a structure and a type of the thin film transistor. The first gate electrode G1 and the first capacitor electrode C1 may be formed by the same process. Further, the first gate electrode G1 and the first capacitor electrode C1 may be formed of the same material on the same layer.

The first insulating layer 113a may be disposed above the first gate insulating layer 112a, the first gate electrode G1, and the first capacitor electrode C1. The first insulating layer 113a may be configured by a single layer of silicon nitride (SiNx) or silicon oxide (SiOx) or a multi-layer thereof. In the first insulating layer 113a, a contact hole for exposing the first source region and the first drain region of the first active layer A1 of the first thin film transistor T1 may be formed.

A second capacitor electrode C2 of the storage capacitor Cst may be disposed on the first insulating layer 113a. The second capacitor electrode C2 may be formed by a single layer, or a multi-layer formed of one of molybdenum (Mo), copper (Cu), titanium (Ti), aluminum (Al), chrome (Cr), gold (Au), nickel (Ni), and neodymium (Nd) or an alloy thereof. The second capacitor electrode C2 may be formed on the first insulating layer 113a and may overlap the first capacitor electrode C1. Further, the second capacitor electrode C2 may be formed of the same material as the first capacitor electrode C1. The second capacitor electrode C2 may be omitted based on a driving characteristic of the display apparatus 100 and a structure and a type of the thin film transistor.

The second buffer layer 114 may be disposed on the first insulating layer 113*a* and the second capacitor electrode C2. The second buffer layer 114 may be configured by a single layer of silicon nitride (SiNx) or silicon oxide (SiOx) or a multi-layer thereof. A contact hole for exposing the first source region and the first drain region of the first active layer A1 of the first thin film transistor T1 may be formed in the second buffer layer 114. Further, in the second buffer layer 114, a contact hole for exposing the second capacitor electrode C2 of the storage capacitor Cst may be formed.

The second buffer layer 114 may be formed by a multi-layer but is not limited thereto.

The second active layer A2 of the second thin film transistor T2 may be disposed on the second buffer layer 114. Here, the second thin film transistor T2 may include a second active layer A2, a second gate insulating layer 112*b*, a second gate electrode G2, a second source electrode S2, and a second drain electrode D2. Here, depending on the design of the pixel circuit, the second source electrode S2 may serve as a drain electrode and the second drain electrode D2 may serve as a source electrode.

Further, the second active layer A2 may include a second channel region in which a channel is formed when the second thin film transistor T2 is driven and a second source region and a second drain region on both sides of the second channel region. The second source region may refer to a part of the second active layer A2 which is connected to the second source electrode S2 and the second drain region may refer to a part of the second active layer A2 which is connected to the second drain electrode D2.

The second active layer A2 may be formed of an oxide semiconductor. The oxide semiconductor material has a large band gap as compared with a silicon material so that electrons cannot jump over the band gap in an off state. Therefore, the oxide semiconductor material has a low off-current. Therefore, the thin film transistor including an active layer which is formed of an oxide semiconductor may be suitable for a switching thin film transistor which maintains on-time to be short and off-time to be long but is not limited thereto. Depending on the characteristic of the display apparatus 100, the oxide semiconductor may be applied as a driving thin film transistor. Further, due to the small off-current, a magnitude of an auxiliary capacitance may be reduced so that the oxide semiconductor may be appropriate for a high resolution display element. For example, the second active layer A2 may be formed of metal oxide and for example, may be formed of various metal oxide such as indium-gallium-zinc-oxide (IGZO). Here, the description was made under assumption that the second active layer A2 of the second thin film transistor T2 is configured by IGZO, among various metal oxides, but it is not limited thereto. Therefore, the active layer may be formed of another metal oxide such as indium-zinc-oxide (IZO), indium-gallium-tin-oxide (IGTO), and indium-gallium-oxide (IGO), rather than IGZO.

The second active layer A2 may be formed by depositing the metal oxide on the second buffer layer 114, performing a heat treatment for stabilization, and then patterning the metal oxide.

The second gate insulating layer 112*b* may be disposed on the entire substrate 110 including the second active layer A2. For example, the second gate insulating layer 112*b* may be configured by a single layer of one of silicon nitride (SiNx), silicon oxide (SiOx), and a multi-layer thereof.

The second gate electrode G2 may be disposed on the second gate insulating layer 112*b*.

The second gate electrode 134 may be formed by a single layer or a multi-layer formed of one of molybdenum (Mo), copper (Cu), titanium (Ti), aluminum (Al), chrome (Cr), gold (Au), nickel (Ni), and neodymium (Nd) or an alloy thereof.

For example, a metal material is formed on the second gate insulating layer 112*b*, a photoresist pattern is formed on the metal material, and then the metal material is wet-etched using the photoresist pattern as a mask to form the second gate electrode G2. As a wet etchant for etching the metal material, a material which selectively etches molybdenum (Mo), copper (Cu), titanium (Ti), aluminum (Al), chrome (Cr), gold (Au), nickel (Ni), and neodymium (Nd) or an alloy thereof which configures the metal material but does not etch the insulating material may be used.

The second insulating layer 113*b* may be disposed on the second gate insulating layer 112*b* and the second gate electrode G2. A contact hole for exposing the first active layer A1 of the first thin film transistor T1 and the second active layer A2 of the second thin film transistor T2 may be formed in the second insulating layer 113*b*. For example, a contact hole for exposing the first source region and the first drain region of the first active layer A1 of the first thin film transistor T1 may be formed in the second insulating layer 113*b*. A contact hole for exposing the second source region and the second drain region of the second active layer A2 of the second thin film transistor T2 may be formed in the second insulating layer 113*b*.

The second insulating layer 113*b* may be configured as a single layer of silicon nitride (SiNx) or silicon oxide (SiOx) or a multi-layer thereof.

A first connection electrode CE1, the first source electrode S1 and the first drain electrode D1 of the first thin film transistor T1 and the second source electrode S2 and the second drain electrode D2 of the second thin film transistor T2 may be disposed on the second insulating layer 113*b*.

The first connection electrode CE1 may be electrically connected to the second drain electrode D2 of the second thin film transistor T2. Further, the first connection electrode CE1 may be electrically connected to the second capacitor electrode C2 of the storage capacitor Cst through the contact holes formed in the second buffer layer 114 and the second insulating layer 113*b*. That is, the first connection electrode CE1 may serve to electrically connect the second capacitor electrode C2 of the storage capacitor Cst and the second drain electrode D2 of the second thin film transistor T2 to each other.

Here, the first source electrode S1 and the first drain electrode D1 of the first thin film transistor T1 may be connected to the first active layer A1 of the first thin film transistor T1 through the contact holes formed in the first gate insulating layer 112*a*, the first insulating layer 113*a*, the second buffer layer 114, and the second insulating layer 113*b*.

The second source electrode S2 and the second drain electrode D2 of the second thin film transistor T2 may be connected to the second active layer A2 through the contact hole formed in the second insulating layer 113*b*.

The first connection electrode CE1, the first source electrode S1 and the first drain electrode D1 of the first thin film transistor T1 and the second source electrode S2 and the second drain electrode D2 of the second thin film transistor T2 may be formed of the same material by the same process.

For example, the first connection electrode CE1, the first source electrode S1 and the first drain electrode D1 of the first thin film transistor T1 and the second source electrode S2 and the second drain electrode D2 of the second thin film transistor T2 may be formed by a single layer or a multi-layer formed of one of molybdenum (Mo), copper (Cu), titanium (Ti), aluminum (Al), chrome (Cr), gold (Au), nickel (Ni), and neodymium (Nd) or an alloy thereof. For example, the first connection electrode CE1, the first source electrode S1 and the first drain electrode D1 of the first thin film transistor T1 and the second source electrode S2 and the second drain electrode D2 of the second thin film transistor T2 may be formed of a triple layered structure of titanium (Ti)/aluminum (Al)/titanium (Ti) but are not limited thereto.

The first connection electrode CE1 may be integrally formed to be connected to the second drain electrode D2 of the second thin film transistor T2 but is not limited thereto.

The first planarization layer 115a may be disposed above the first connection electrode CE1, the first source electrode S1 and the first drain electrode D1 of the first thin film transistor T1 and the second source electrode S2 and the second drain electrode D2 of the second thin film transistor T2, and the second insulating layer 113b.

The first planarization layer 115a may be an organic layer which planarizes and protects upper portions of the first thin film transistor T1 and the second thin film transistor T2. For example, the first planarization layer 115a may be formed of an organic material such as acryl resin, epoxy resin, phenolic resin, polyamide resin, or polyimide resin.

The second connection electrode CE2 may be disposed on the first planarization layer 115a. The second connection electrode CE2 may be connected to the second drain electrode D2 of the second thin film transistor T2 through the contact hole of the first planarization layer 115a. The second connection electrode CE2 may serve to electrically connect the second thin film transistor T2 and the first electrode 121 with each other. The second connection electrode CE2 may be formed by a single layer, or a multi-layer formed of one of molybdenum (Mo), copper (Cu), titanium (Ti), aluminum (Al), chrome (Cr), gold (Au), nickel (Ni), and neodymium (Nd) or an alloy thereof. The second connection electrode CE2 may be formed of the same material as the second source electrode S2 and the second drain electrode D2 of the second thin film transistor T2.

The second planarization layer 115b may be disposed above the second connection electrode CE2 and the first planarization layer 115a. For example, the second planarization layer 115b may be formed of an organic material, such as acryl resin, epoxy resin, phenolic resin, polyamide resin, or polyimide resin.

The light emitting diode 120 may be disposed on the second planarization layer 115b.

The first electrode 121 may be disposed on the second planarization layer 115b. At this time, the first electrode 121 may be electrically connected to the second connection electrode CE2 through the contact hole provided in the second planarization layer 115b. The first electrode 121 may be formed of a metallic material.

When the display apparatus 100 is a top emission type in which light emitted from the light emitting diode 120 is emitted above the substrate 110 in which the light emitting diode 120 is disposed, the first electrode 121 may further include a transparent conductive layer and a reflective layer on the transparent conductor layer. The transparent conductive layer may be formed of a transparent conductive oxide such as ITO and IZO and the reflective layer may be formed of silver (Ag), aluminum (Al), gold (Au), molybdenum (Mo), tungsten (W), chrome (Cr), or an alloy thereof.

The bank 116a may be disposed to cover the first electrode 121. A part of the bank 116a corresponding to an emission area of the sub pixel may be open. A part of the first electrode 121 may be exposed through the open part of the bank 116a (hereinafter, referred to as an open area). At this time, the bank 116a may be formed of an inorganic insulating material, such as silicon nitride (SiNx) or silicon oxide (SiOx), or an organic insulating material, such as benzocyclobutene resin, acrylic resin, or imide resin, but is not limited thereto. The spacer 116b may be further disposed on the bank 116a.

The light emitting layer 122 may be disposed in the open area of the bank 116a and in the vicinity of the open area of the bank. Therefore, the light emitting layer 122 may be disposed on the first electrode 121 exposed through the open area of the bank 116a.

The second electrode 123 may be disposed on the light emitting layer 122.

The light emitting diode 120 may be formed by the first electrode 121, the light emitting layer 122, and the second electrode 123. The light emitting layer 122 may include a plurality of organic films.

For example, the first electrode 121 may be an anode electrode or a cathode electrode. For example, the second electrode 123 may be a cathode electrode or an anode electrode.

The encapsulation layer 117 may be located on the light emitting diode 120.

The encapsulation layer 117 may have a single layer structure or a multi-layered structure. For example, the encapsulation layers 117 may include a first encapsulation layer 117a, a second encapsulation layer 117b, and a third encapsulation layer 117c.

For example, the first encapsulation layer 117a and the third encapsulation layer 117c may be configured by inorganic films and the second encapsulation layer 117b may be configured by an organic film. Among the first encapsulation layer 117a, the second encapsulation layer 117b, and the third encapsulation layer 117c, the second encapsulation layer 117b is thickest and may serve as a planarization layer.

The first encapsulation layer 117a may be disposed on the second electrode 123 and may be disposed to be most adjacent to the light emitting diode 120. The first encapsulation layer 117a may be formed of an inorganic insulating material on which low-temperature deposition may be performed. For example, the first encapsulation layer 117a may be configured by silicon nitride (SiNx), silicon oxide (SiOx), silicon oxynitride (SiON), or aluminum oxide (Al2O3). The first encapsulation layer 117a is deposited under a low temperature atmosphere so that during the deposition process, the damage of the light emitting layer 122 including an organic material which is vulnerable to the high temperature atmosphere may be suppressed.

The second encapsulation layer 117b may be formed to have a smaller area than that of the first encapsulation layer 117a. In this case, the second encapsulation layer 117b may be formed to expose both ends of the first encapsulation layer 117a. The second encapsulation layer 117b may serve as a buffer to alleviate stress between the layers due to bending of the flexible display apparatus and to enhance planarization performance.

For example, the second encapsulation layer 117b may be formed of an organic insulating material, such as acrylic resin, epoxy resin, polyimide, polyethylene, and silicon oxy carbon (SiOC). For example, the second encapsulation layer 117b may be formed by an inkjet method but is not limited thereto.

The third encapsulation layer 117c may be formed above the substrate 110 on which the second encapsulation layer 117b is formed to cover upper surfaces and side surfaces of the second encapsulation layer 117b and the first encapsulation layer 117a, respectively. At this time, the third encapsulation layer 117c may minimize or block the permeation of external moisture or oxygen into the first encapsulation layer 117a and the second encapsulation layer 117b. For example, the third encapsulation layer 117c may be configured by an inorganic insulating material, such as silicon nitride (SiNx), silicon oxide (SiOx), silicon oxynitride (SiON), or aluminum oxide (Al2O3).

In the non-active area NA, a dam which blocks the flow of the second encapsulation layer 117b which configures the encapsulation layer 117 may be further disposed but is not limited thereto. For example, the dam is formed to have a closed curve which encloses the active area AA in the non-active area NA and the first encapsulation layer 117a and the third encapsulation layer 117c are disposed on the dam and the flow of the second encapsulation layer 117b may be blocked by the dam.

For example, a color filter may be disposed on the encapsulation layer 117 but is not limited thereto.

The touch sensing layer may be disposed on the encapsulation layer 117.

For example, a touch buffer film 118a may be disposed above the third encapsulation layer 117c and a touch electrode TE may be disposed on the touch buffer film 118a.

The touch electrode TE may include a touch sensor metal TS and a bridge metal BM located on different layers. A touch interlayer insulating film 118b may be disposed between the touch sensor metal TS and the bridge metal BM.

For example, the touch sensor metal TS may include a first touch sensor metal, a second touch sensor metal, and a third touch sensor metal which are disposed to be adjacent to each other. The first touch sensor metal and the second touch sensor metal are electrically connected. However, when the third touch sensor metal is disposed between the first touch sensor metal and the second touch sensor metal, the first touch sensor metal and the second touch sensor metal may be electrically connected by means of the bridge metal BM disposed on a different layer. The bridge metal BM may be insulated from the touch sensor metal TS by a touch interlayer insulating film 118b.

When the touch sensing unit is formed, chemicals (for example, developer, etchant, or the like) used for the process, moisture from the outside, or the like may be generated. The touch buffer film 118a is disposed and the touch sensing unit is disposed thereon to suppress the permeation of chemicals, moisture, or the like during the manufacturing of the touch sensing unit into the light emitting layer 122 including an organic material. By doing this, the touch buffer film 118a may suppress the damage of the light emitting layer 122 which is vulnerable to the chemicals or the moisture.

The touch buffer film 118a may be formed of an organic insulating material which is formed at a temperature lower than a predetermined temperature (for example, 100° C.) to suppress the damage of the light emitting layer 122 including an organic material which is vulnerable to a high temperature. The organic insulating material has a low permittivity of 1 to 3. For example, the touch buffer film 118a may be formed of an acrylic, epoxy, or siloxane-based material. As the flexible display apparatus is bent, the encapsulation unit 117 may be damaged and the touch sensor metal TS disposed above the touch buffer film 118a may be broken. Even though the flexible display apparatus is bent, the touch buffer film 118a which is configured of an organic insulating material to have a planarization performance may suppress the damage of the encapsulation layer 117 and the breakage of the metals TS and BM which configure the touch electrode TE.

The organic material layer 119 may be disposed to cover the touch electrode TE. The organic material layer 119 may be configured by an organic insulating film.

According to the exemplary aspect of the present disclosure, when the organic material layer 119 is formed, the developer which is used for the process may remain above the organic material layer 119, and this will be described below with reference to FIG. 7.

For example, a polarization layer may be disposed on the organic material layer 119.

The polarization layer suppresses reflection of external light on the active area AA of the substrate 110. When the display apparatus 100 is used at the outside, external natural light enters to be reflected by a reflective layer included in the first electrode 121 of the light emitting diode 120 or reflected by an electrode which is formed of a metal and disposed below the light emitting diode 120. Therefore, the image of the display apparatus 100 may not be visibly recognized due to the light reflected as described above. The polarization layer polarizes the light entering from the outside to a specific direction and suppresses the reflected light from being emitted to the outside of the display apparatus 100.

A cover glass may be bonded on the polarization layer by an adhesive layer. The adhesive layer may serve to bond the components of the display apparatus 100 to each other, and for example, may be formed using an optically clear display adhesive, such as a pressure sensitive adhesive, an optical clear adhesive (OCR) or an optical clear resin (OCR), but is not limited thereto.

The cover glass may protect the component of the display apparatus 100 from the external impact and suppress damages such as a scratch.

Hereinafter, the plurality of wiring lines 130 will be described in detail with reference to FIGS. 5 to 7 together.

Figure 5:
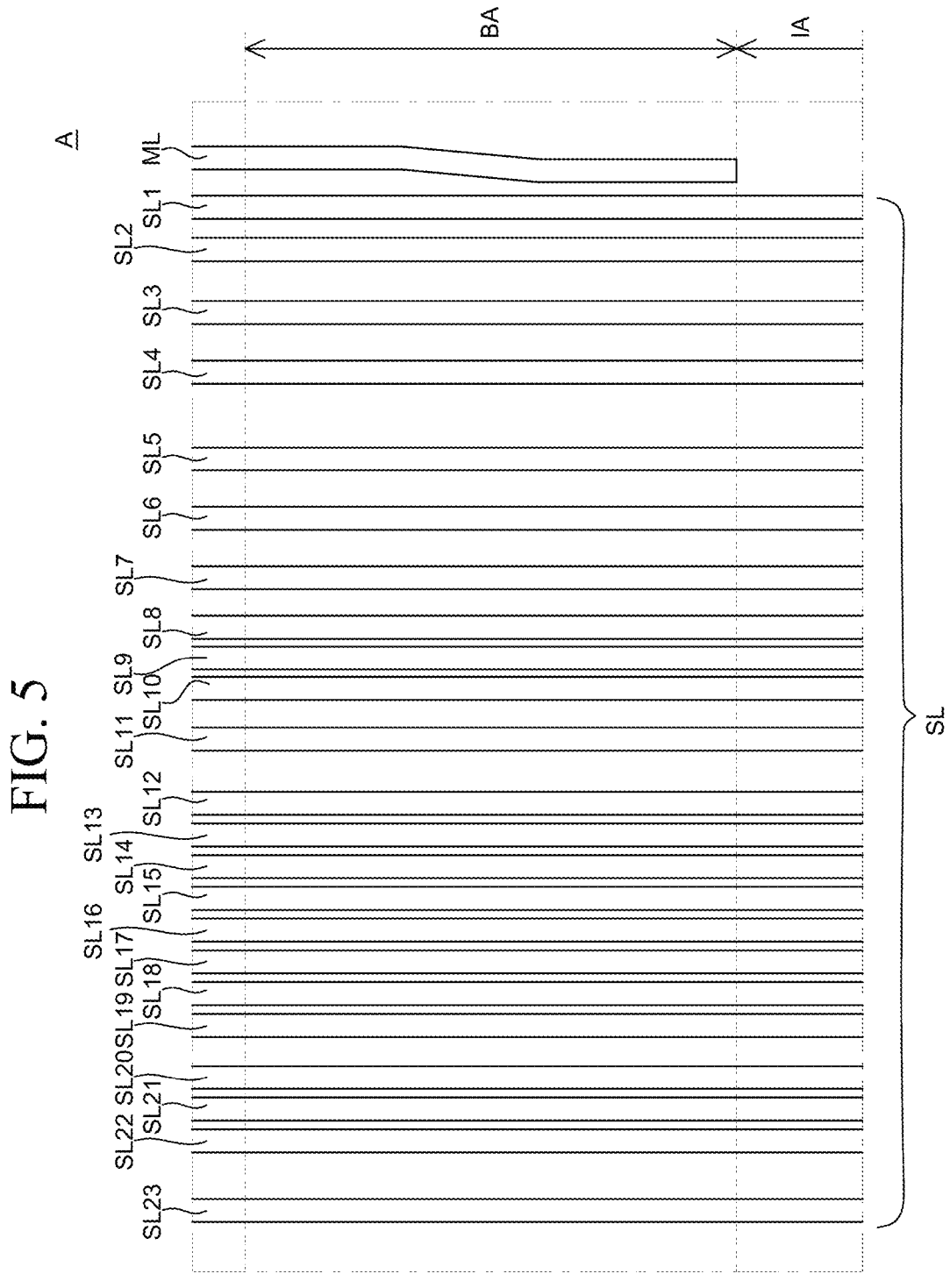
FIG. 5 is a view of area A of FIG. 3.
Figure 8:
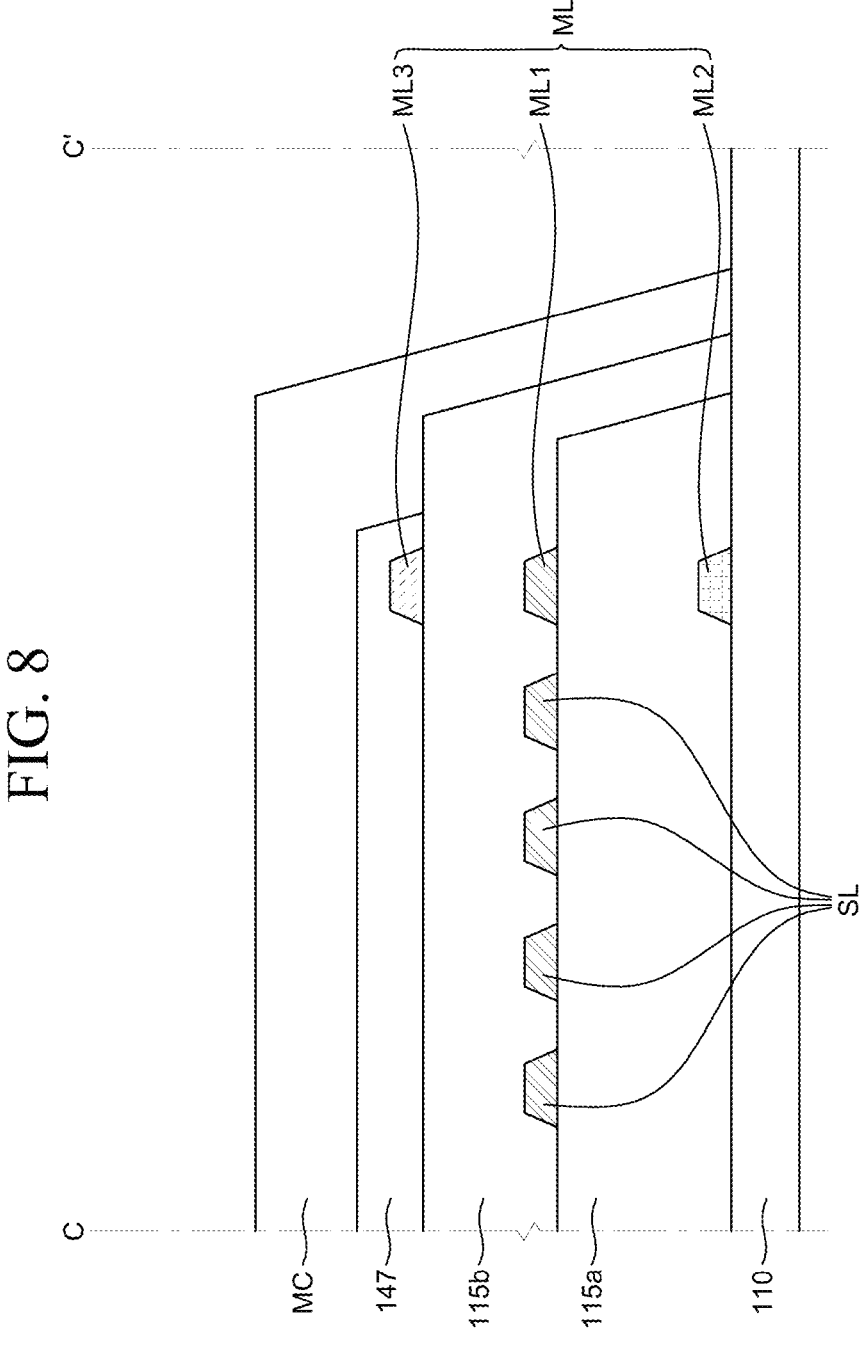
FIG. 8 is a cross-sectional view taken along line C-C' of FIG. 3 according to an exemplary aspect of the present disclosure.
Figure 9:
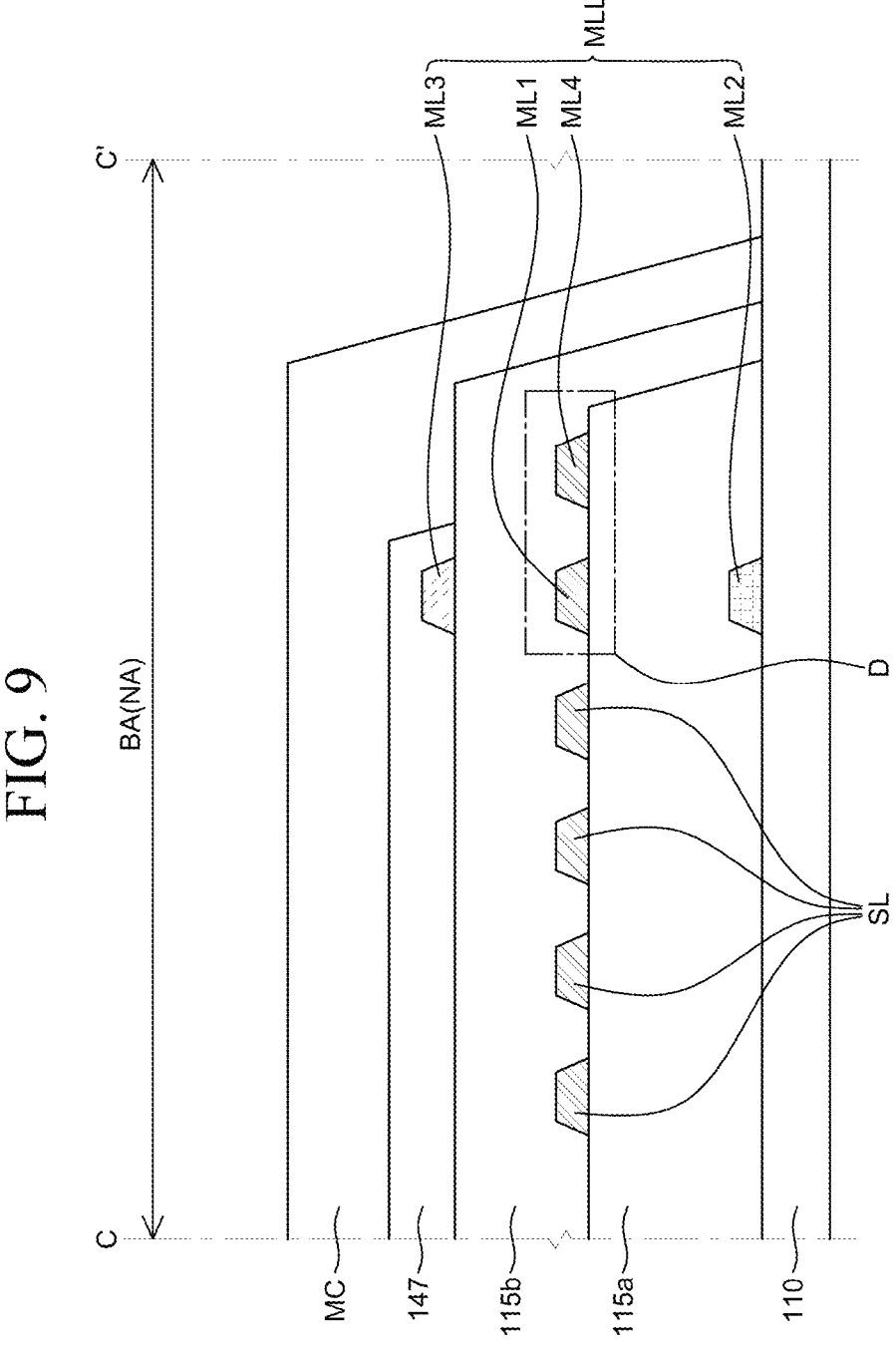
FIG. 9 is a cross-sectional view of line C-C' of FIG. 3 according to another exemplary aspect of the present disclosure.
Figure 10:
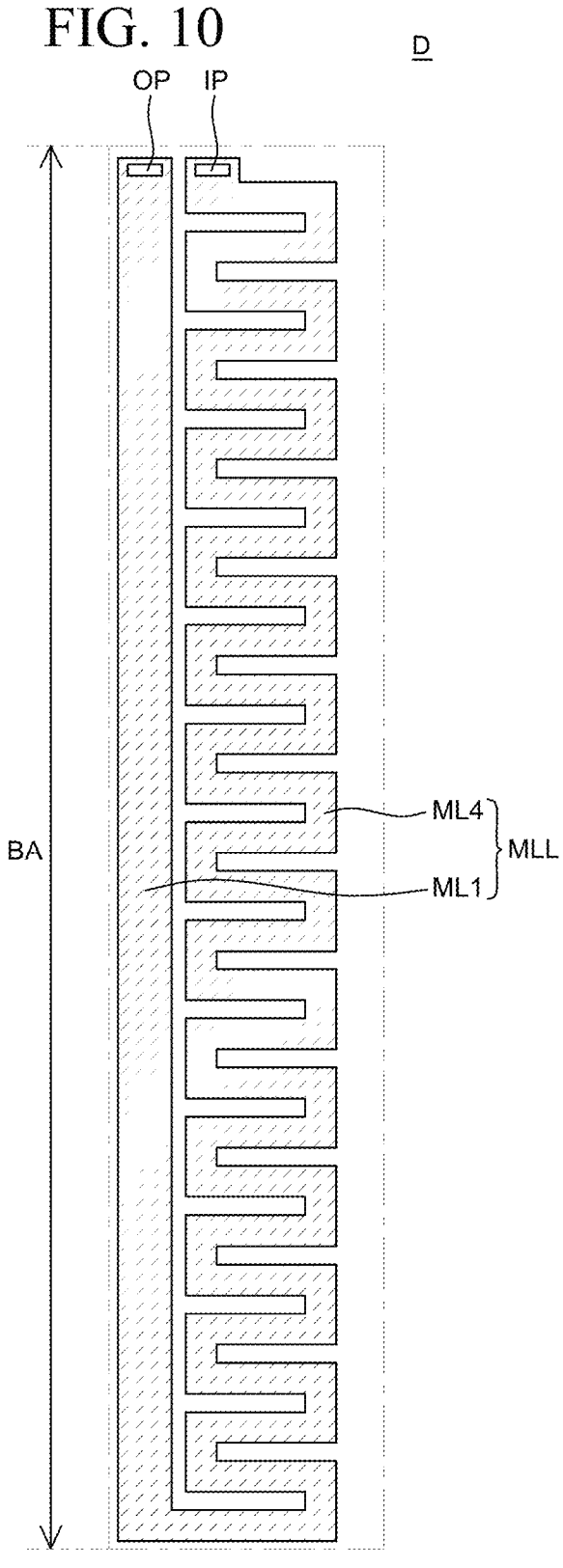
FIG. 10 is a plan view of area D of FIG. 9 according to an exemplary aspect of the present disclosure.
Figure 11:
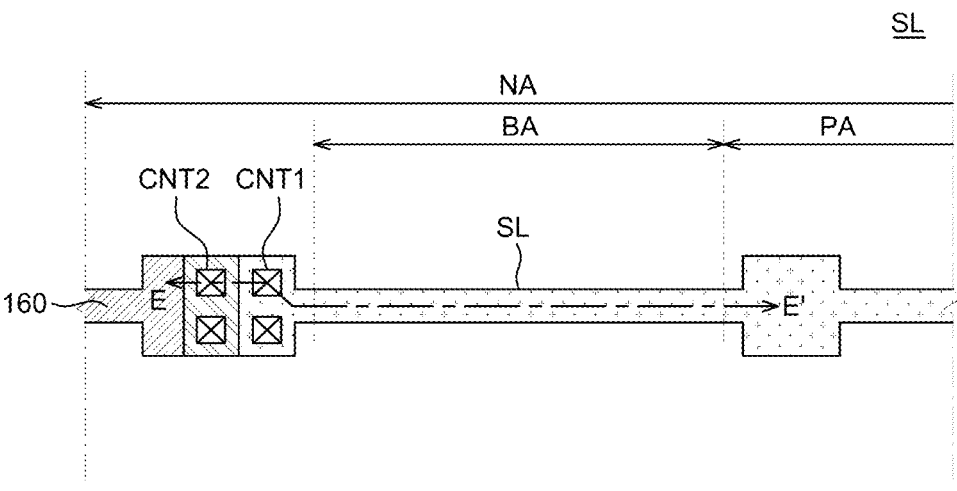
FIG. 11 is a plan view of a plurality of signal lines according to an exemplary aspect of the present disclosure.
Figure 12:
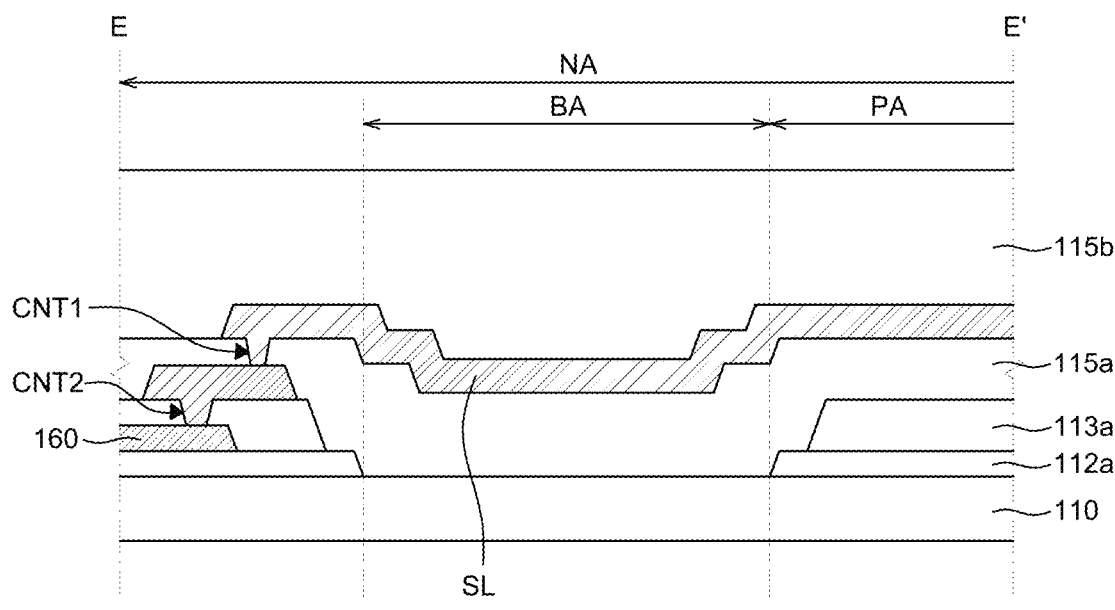
FIG. 12 is a cross-sectional view of line E-E' of FIG. 11.

FIG. 5 is a view of area A of FIG. 3. FIG. 6 is a cross-sectional view of line B-B' of FIG. 3 according to an exemplary aspect of the present disclosure. FIG. 7 is a cross-sectional view of line B-B' of FIG. 3 according to another exemplary aspect of the present disclosure. FIG. 8 is a cross-sectional view of line C-C' of FIG. 3 according to an exemplary aspect of the present disclosure. FIG. 9 is a cross-sectional view of line C-C' of FIG. 3 according to another exemplary aspect of the present disclosure. FIG. 10 is a plan view of area D of FIG. 9 according to an exemplary aspect of the present disclosure. FIG. 11 is a plan view of a plurality of signal lines according to an exemplary aspect of the present disclosure. FIG. 12 is a cross-sectional view of line E-E' of FIG. 11.

FIG. 5 is a view enlarging a plurality of wiring lines 130 of the display apparatus 100 of FIG. 3 according to an exemplary aspect of the present disclosure. FIG. 6 is a cross-sectional view of at least one protection line ML according to an exemplary aspect of the present disclosure. FIGS. 11 and 12 are a plan view and a cross-sectional view illustrating a plurality of signal lines SL, respectively.

Referring to FIG. 5, according to an exemplary aspect of the present disclosure, the display apparatus 100 may include at least one protection line ML which is disposed at the outer portion of the plurality of signal lines SL in the non-active area NA, such as a bending area BA, for example, closer to an end of the bending area BA than the plurality of signal lines SL in a width direction of the bending area BA.

For example, referring to FIG. 3, at least one protection line ML may be disposed at both outer ends of the bending area BA.

Figure 6:
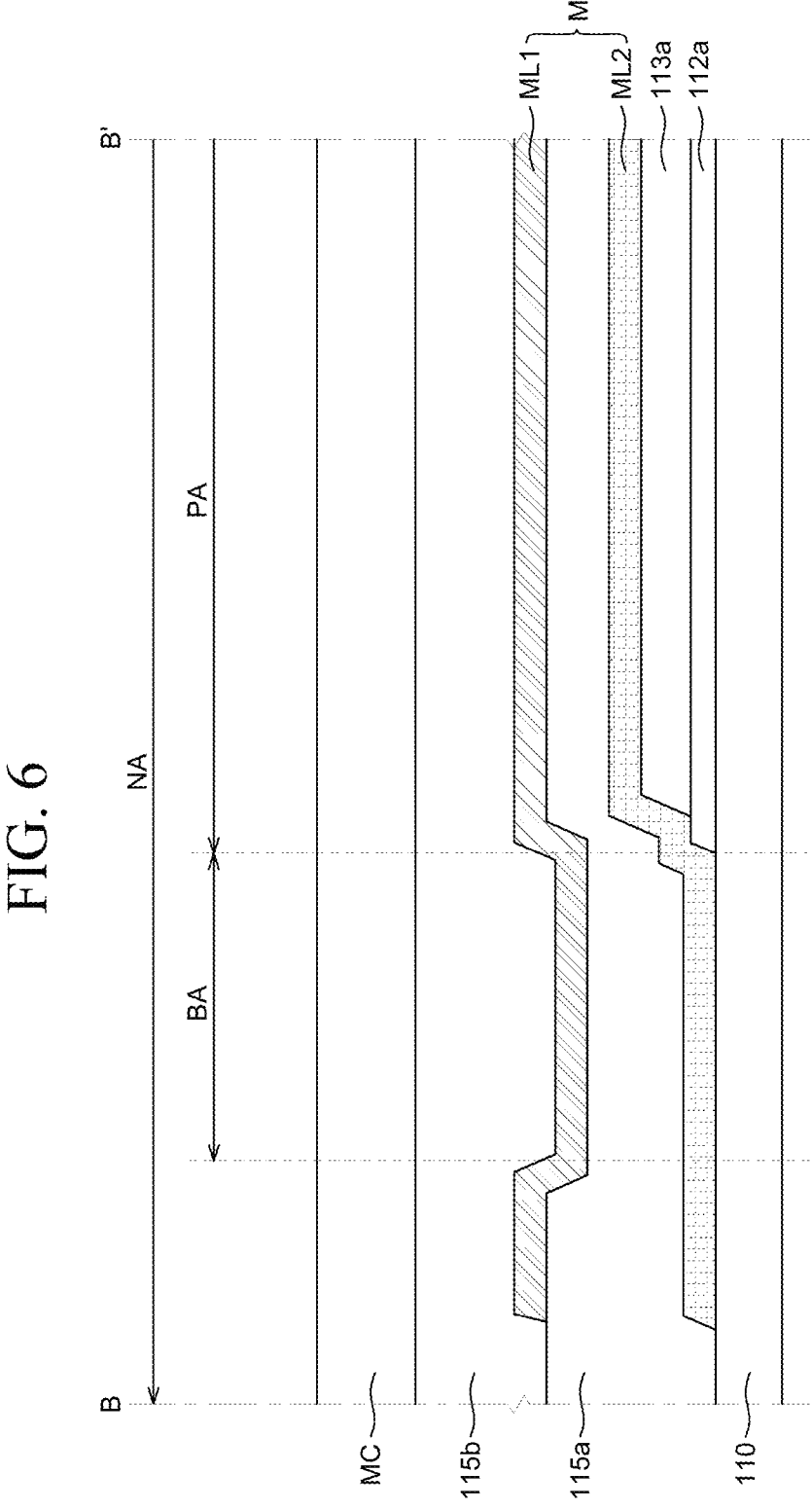
FIG. 6 is a cross-sectional view taken along line B-B' of FIG. 3.

Referring to FIGS. 6 and 12, the bending area BA includes the first planarization layer 115a on the substrate 110 and the second planarization layer 115b on the first planarization layer 115a. The plurality of signal lines SL and at least one protection line ML may be disposed between the substrate 110 and the second planarization layer 115b.

Referring to FIG. 6, according to the exemplary aspect of the present disclosure, at least one protection line ML may include a first wiring line ML1 and/or the second wiring line ML2.

Figure 7:
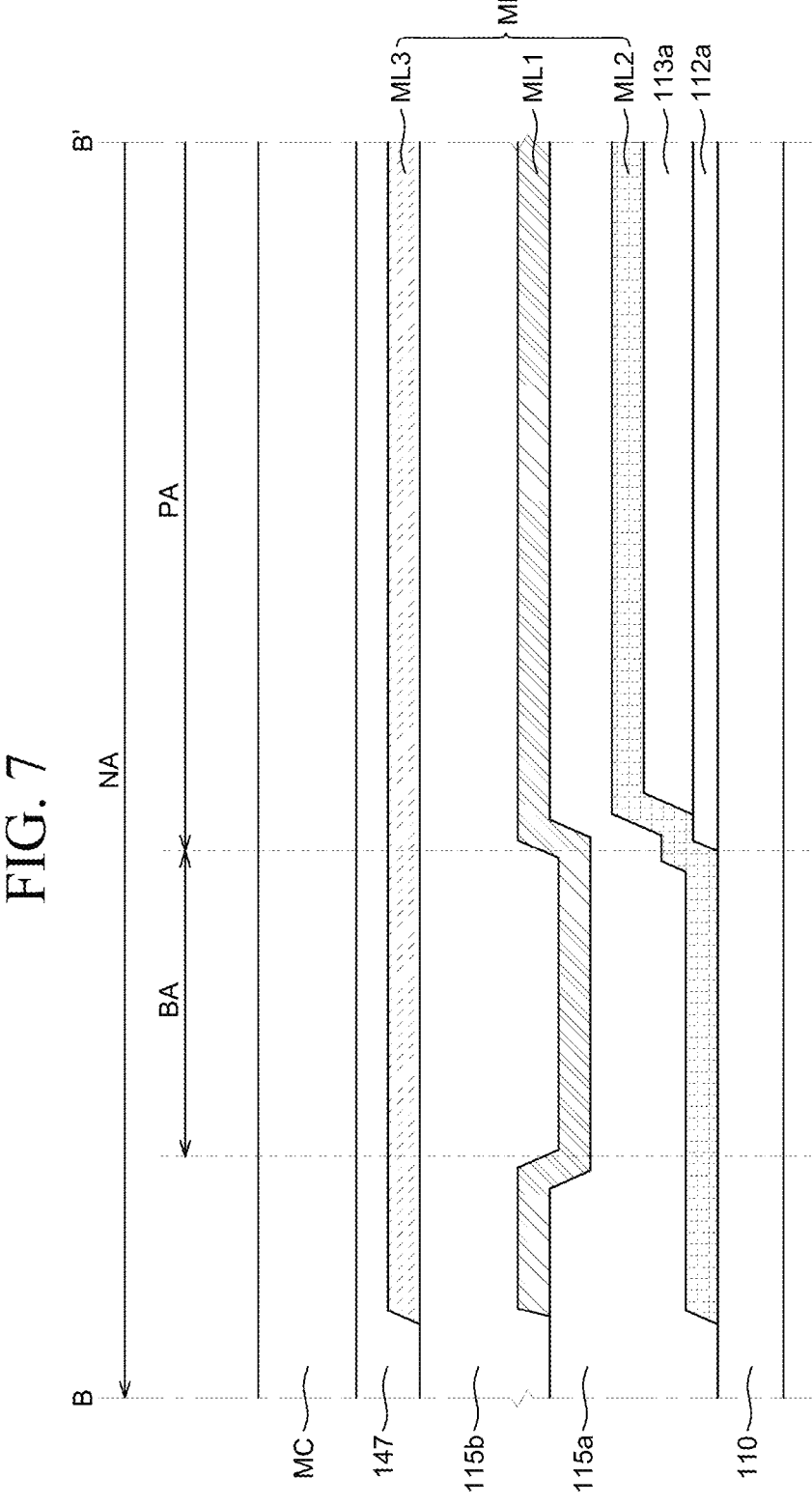
FIG. 7 is a cross-sectional view of line B-B' of FIG. 3 according to another exemplary aspect of the present disclosure.

FIG. 7 is a cross-sectional view of line B-B' of FIG. 3 according to another exemplary aspect of the present disclosure and a third wiring line ML3 and an overcoat layer 147 may be further disposed between the second planarization layer 115b and the protection layer MC as compared with FIG. 5. An overlapping description with FIG. 6 will be omitted.

Referring to FIG. 7, the bending area BA includes the first planarization layer 115a on the substrate 110 and the second planarization layer 115b on the first planarization layer 115a. The plurality of signal lines SL and at least one protection line ML may be disposed between the substrate 110 and the overcoat layer 147.

Referring to FIG. 7, according to the exemplary aspect of the present disclosure, at least one protection line ML may include a first wiring line ML1 and/or the second wiring line ML2 and/or a third wiring line ML3.

For example, the first wiring line ML1 may be disposed on at least one of the substrate 110, the first gate insulating layer 112a, the first insulating layer 113a, or the first planarization layer 115a, and the first wiring line ML1, the second wiring line ML2 and the third wiring line ML3 are separated from one another by one of the first planarization layer 115a and the second planarization layer 115b as shown in FIG. 7. In addition, the first wiring line ML1, the second wiring line ML2 and the third wiring line ML3 may have different lengths.

For example, the second wiring line ML2 may be disposed on at least one of the substrate 110, the first gate insulating layer 112a or the first insulating layer 113a.

For example, the overcoat layer 147 may be the same material as the bank 116a in the active area AA.

In the bending area BA, a protection layer (MC) may be further disposed on the second planarization layer 115b and/or the overcoat layer 147. For example, the protection layer MC may be an organic material. The exemplary aspects of the present disclosure are not limited thereto.

When the panel is bent, a tensile force is applied to the plurality of wiring lines 130 disposed above the substrate 110 to cause the crack. Therefore, to suppress the crack, the protection layer MC is formed by coating a resin with a small thickness in a location to be bent to protect the plurality of wiring lines 130. For example, the protection layer MC disposed in the bending area BA may not only suppress the cracks of the plurality of signal lines SL disposed in the bending area BA, but also adjust a neutral plane of the bending area BA.

For example, when the product driving reliability is evaluated, there may be a problem in that a wiring line (for example, a gate circuit line) which is disposed in the bending area to supply a driving signal from the driving integrated circuit to the gate driver may be cracked. For example, there was a problem in that a signal supply wiring line was corroded and cracked by tetramethylammonium hydroxide (TMAH) which remained above the second planarization layer in the bending area.

For example, mobile ions may be generated above the bending area during the manufacturing process of the display apparatus. For example, a remaining component TMAH of the developer used to develop the organic material layer may remain on the touch sensing layer. At this time, when the remaining TMAH reacts with the moisture ($H2O$), TMAH dissociates to produce positive ions (for example, $N(CH3)4+$) of TMA+.

After manufacturing the display apparatus, for example, when the product is driven in a high temperature and high moisture reliable environment, a voltage is applied to the gate circuit line disposed in the bending area. TMA+ positive ions remaining on an upper interface of the protection layer MC which is an organic material of the bending area BA are attracted to the low-voltage line to which an opposite polarity is applied, among the gate circuit lines, due to the electric field generated at this time. Further, following corrosion reaction formulae (1) to (3) sequentially occur in a wiring line including aluminum to cause the total corrosion. For example, when it is driven at 1 Hz, as a time when a specific wiring line, among the gate circuit lines, maintains a low voltage increases, TMA+ positive ions are easily attracted to the gate circuit lines to cause the corrosion.

$$N(CH3)4OH+H2O \rightarrow [N(CH3)4++OH-]+[H2O+H++OH-] \quad \text{Corrosion Reaction Formula (1)}$$

$$Al \rightarrow Al3++3e-, Al3++2OH \rightarrow Al(OH)2+, Al3++3OH \rightarrow Al(OH)3, \quad \text{Corrosion Reaction Formula (2)}$$

$$Al(OH)2++N(CH3)4OH \leftrightarrow Al(OH)3 \cdot N(CH3)4 \quad \text{Corrosion Reaction Formula (3)}$$

For example, this problem may become more severe when a thin film transistor formed of a low temperature polycrystalline silicon and a thin film transistor formed of an oxide semiconductor are used together to be driven at a low voltage.

In the exemplary aspect of the present disclosure, as illustrated in FIG. 3, at least one protection line ML may be included which is disposed at the outside of the plurality of signal lines SL which is gate circuit lines which transmit a signal from the driving integrated circuit 150 disposed in the pad area PA to the gate driver 154, for example, closer to an outer portion end of the bending area BA than the plurality of signal lines SL in the width direction of the bending area BA. For example, at least one protection line ML is applied with a lower voltage than that of the plurality of signal lines SL to suppress the cracks generated in the plurality of signal lines SL.

According to the exemplary aspect of the present disclosure, a signal of a lower voltage than those of the plurality of signal lines SL and/or a negative voltage or the same voltage is applied to at least one protection line ML disposed closer to the end of the width of the bending area BA than the plurality of signal lines SL in the width direction of the bending area BA. Therefore, at least one protection line ML has a lower voltage than that of the plurality of signal lines SL. Accordingly, even though TMAH (tetramethylammonium hydroxide) remaining above the second planarization layer 115b reacts with the moisture $H2O$ to produce positive ions of TMA+, TMA+ positive ions enter at least one protection line ML which transmits a signal with the lowest voltage to react. Accordingly, TMA+ positive ions do not react with the plurality of signal lines SL so that the crack of the wiring line (for example, the plurality of signal lines SL) which supplies a driving signal from the driving integrated circuit 150 disposed in the pad area PA to the gate driver 154 may be suppressed.

For example, referring to FIGS. 6 and 7, at least one protection line ML may be two or more or plural. In the exemplary aspect, at least one protection line ML may be one and the exemplary aspects of the present disclosure are not limited thereto.

For example, referring to FIG. 6, at least one protection line ML may include a first wiring line ML1 and/or the second wiring line ML2. In the exemplary aspect, the first wiring line ML1 may be applied with a lower voltage than that of the signal line SL, a negative (−) voltage or the same voltage. The second wiring line ML2 is disposed below the first wiring line ML1 to transmit a higher voltage than that of the signal line SL and/or the first wiring line ML1 or a positive (+) signal or the same voltage signal. One end of the protection line ML, for example, one end of the first wiring line ML1 and one end of the second wiring line ML2 may be electrically connected to the driving integrated circuit 150. In the exemplary aspect, one end of the first wiring line ML1 and one end of the second wiring line ML2 may be connected to the driving integrated circuit 150 through a link line and the exemplary aspects of the present disclosure are not limited thereto. For example, the second wiring line ML2 may be disposed on the substrate 110, the first planarization layer 115*a* may be disposed on the second wiring line ML2, the first wiring line ML1 may be disposed on the first planarization layer 115*a*, the second planarization layer 115*b* may be disposed on the first wiring line ML1, and the protection layer MC may be disposed on the second planarization layer 115*b*.

For example, a strong electric field E-field is formed between the first wiring line ML1 and the second wiring line ML2 so that TMA+ ions produced in the high temperature and high humidity reliable environment are attracted to at least one protection line ML including the first wiring line ML1 and the second wiring line ML2 to be coupled, rather than the plurality of signal lines SL to which a low voltage or a negative (−) voltage are applied. For example, the second wiring line ML2 may include the same material as the first source electrode S1 and the first drain electrode D1 or may be disposed on the same layer. For example, at least one protection line ML may be a triple layer. For example, at least one protection line ML may include titanium (Ti) and aluminum (Al).

For example, referring to FIGS. 7 and 8, at least one protection line ML may include a first wiring line ML1 and/or the second wiring line ML2 and/or a third wiring line ML3. In the exemplary aspect, the first wiring line ML1 may be applied with a lower voltage than that of the signal line SL or a negative (−) voltage. The second wiring line ML2 may be disposed below the first wiring line ML1 and the third wiring line ML3 may be disposed above the first wiring line ML1. A voltage which is equal to or higher than that of the signal line SL and/or the first wiring line ML1 and/or a positive (+) signal may be transmitted to the second wiring line ML2 and the third wiring line ML3. One end of the first wiring line ML1, one end of the second wiring line ML2, and one end of the third wiring line ML3 may be electrically connected to the driving integrated circuit 150 through a link line.

For example, an electric field E-field may be formed between the first wiring line ML1 and the second wiring line ML2 and an electric field E-field may be formed between the first wiring line ML1 and the third wiring line ML3. Therefore, TMA+ ions produced in the high temperature and high humidity reliable environment are attracted to at least one protection line ML including the first wiring line ML1, the second wiring line ML2, and the third wiring line ML3 to be coupled, rather than the plurality of signal lines SL to which the low voltage or the negative (−) voltage is applied. Therefore, the coupling of the TMA+ ions to the signal line SL may be suppressed to suppress the screen defects.

Referring to FIG. 8, for example, the second planarization layer 115*b* may enclose a side surface of the first planarization layer 115*a*. The first planarization layer 115*a* may enclose a side surface of the second wiring line ML2. The second planarization layer 115*b* may enclose a side surface of the first wiring line ML1. The overcoat layer 147 may enclose a side surface of the third wiring line ML3. The protection layer MC may enclose a side surface of the second planarization layer 115*b* and/or the overcoat layer 147. The first wiring line ML1 and/or the second wiring line ML2 and/or the third wiring line ML3 may be the same material and the exemplary aspects of the present disclosure are not limited thereto.

For example, a plurality of signal lines SL disposed in the non-active area NA including the bending area BA according to an exemplary aspect of the present disclosure will be described with reference to FIGS. 3, 5, 11, and 12 together. One ends of the plurality of signal lines SL may be connected to the driving integrated circuit 150 disposed in the pad area PA and the other ends may be connected to the gate driver 154 of the non-active area NA.

According to an exemplary aspect of the present disclosure, the plurality of signal lines SL may be configured by the same material on the same layer as the second connection electrode CE2 connected to the second drain electrode D2 of the second thin film transistor of the active area AA.

For example, as the plurality of signal lines SL is more adjacent to the inside of the active area AA of the substrate 110 from the outside of the substrate 110 or the non-active area NA, the signal lines may be disposed in the order of start signals SL1 to SL4, clock signals SL5 to SL12, monitor signals SL13 to SL16, high voltage signals SL17 and SL18, a correction voltage signal SL19, low voltage signals SL20 and SL21, and initialization signals SL22 and SL23, but are not limited thereto.

According to the exemplary aspect of the present disclosure, the driving signal from the plurality of driving integrated circuits 150 may be supplied to the sub pixel SP disposed in the active area AA via the plurality of signal lines SL and the gate driver 154.

For example, the plurality of signal lines SL disposed in the non-active area NA including the bending area BA may be electrically connected to the plurality of driving lines 160 extending from the active area AA.

For example, as illustrated in FIGS. 11 and 12, the plurality of signal lines SL may be electrically connected to the plurality of driving lines 160 extending from the active area AA through the first contact hole CNT1 and the second contact hole CNT2. For example, the plurality of driving lines 160 may be disposed on the same layer with the same material as the first gate electrode G1.

For example, each driving line 160 may configure a gate line, a gate high level voltage line, or a gate low level voltage line which transmits a gate signal but is not limited thereto.

According to an exemplary aspect of the present disclosure, at least one protection line ML may be disposed at the outer portion of the width direction of the plurality of signal lines SL in the bending area BA.

For example, one end of at least one protection line ML may be connected to the driving integrated circuit 150 and may be applied with a lower voltage than that of the plurality of signal lines SL.

At least one protection line ML is disposed on the same layer with the same material as the second connection electrode CE2 connected to the second drain electrode D2 of the second thin film transistor of the active area AA.

For example, according to an exemplary aspect of the present disclosure, the first wiring line ML1 of at least one protection line ML may be configured by a wiring line which transmits a signal with a negative (–) voltage.

For example, a signal with a lower voltage than that of the plurality of signal lines SL or a negative voltage is applied to at least one protection line ML disposed at the outer end of the bending area BA than the plurality of signal lines SL in the width direction of the bending area BA. Therefore, at least one protection line ML has a lower voltage than that of the plurality of signal lines SL. Accordingly, even though TMAH (tetramethylammonium hydroxide) remaining above the second planarization layer 115*b* reacts with the moisture H2O to produce positive ions of TMA+, TMA+ positive ions enter at least one protection line ML which transmits a signal with the lowest voltage to react. Accordingly, TMA+ positive ions do not react with the plurality of signal lines SL so that the crack of the wiring line (for example, the plurality of signal lines SL) which supplies a driving signal from the driving integrated circuit 150 disposed in the pad area PA to the gate driver 154 may be suppressed.

For example, moisture H2O permeates from the outside of the display apparatus 100 first. Therefore, when at least one protection line ML is disposed at the outside of the bending area BA in the width direction of the plurality of bending areas BA as illustrated in FIG. 5, TMA+ positive ions produced by moisture permeating from the outside of the bending area BA enter at least one protection line ML to react. Accordingly, the entering of TMA+ positive ions into the plurality of signal lines SL is suppressed to suppress the cracks generated in the plurality of signal lines SL.

In an exemplary aspect, at least one protection line ML serves to suppress the TMA+ positive ions from entering the plurality of signal lines SL. Therefore, as illustrated in FIGS. 5 and 6, one end of at least one protection line ML may be electrically connected to the driving integrated circuit 150 and the other end may be floated without being electrically connected to the other component between the first planarization layer 115*a* and the second planarization layer 115*b*. For example, referring to FIG. 5, the other end of at least one protection line ML may be disposed to the bending area BA, but may not be disposed in a connection area IA which connects the active area AA and the bending area BA. The exemplary aspects of the present disclosure are not limited thereto. For example, one end of at least one protection line ML may be connected to the driving integrated circuit 150 through the link line and the other line may not be connected to the wiring line of the active area AA.

FIG. 9 is a cross-sectional view of line C-C' of FIG. 3 according to another exemplary aspect of the present disclosure.

FIG. 10 is a plan view of area D of FIG. 9.

In FIG. 9, a fourth wiring line ML4 is added in FIG. 8 according to an exemplary aspect of the present disclosure and a redundant description will be omitted. For example, the second planarization layer 115*b* may enclose a side surface of the fourth wiring line ML4 and exemplary aspects of the present disclosure are not limited thereto.

Referring to FIGS. 9 and 10, according to an exemplary aspect of the present disclosure, at least one protection line MLL may include at least one of a first wiring line ML1, a second wiring line ML2, a third wiring line ML3, and a fourth wiring line ML4. For example, the first wiring line ML1 and the fourth wiring line ML4 which are at least one protection line MLL may serve as panel crack detecting (PCD) lines. For example, the first wiring line ML1 and the fourth wiring line ML4 in the bending area BA are separated in a direction closer to the pad area PA and ends in a direction closer to the active area AA may be connected. For example, in the bending area BA, one ends of the first wiring line ML1 and the fourth wiring line ML4 may be separated, and the other ends may be connected.

At least one protection line MLL according to an exemplary aspect of the present disclosure may be electrically connected to the driving integrated circuit 150 and detect a crack when the crack is generated.

For example, an input contact hole IP of at least one protection line MLL and an input pad of the driving integrated circuit 150 may be connected. For example, an output contact hole OP of at least one protection line MLL may be connected to an output pad of the driving integrated circuit 150. For example, a resistance measurement probe is in contact with the input pad and the output pad of the driving integrated circuit 150 to measure a resistance of a signal line which is input and output.

For example, when the plurality of signal lines SL is cracked, whether the plurality of signal lines SL is cracked may be detected based on a changed resistance of one protection wiring line MLL.

According to an exemplary aspect of the present disclosure, at least one protection line MLL may protect the plurality of signal lines SL which is gate driving signal lines and detect whether crack occurs to minimize the defect rate of the display apparatus, thereby improving the reliability.

In the exemplary aspect, referring to FIG. 10, at least a part of at least one protection line MLL may be configured with an embossing structure or a concave-convex structure.

For example, referring to FIG. 10, the fourth wiring line ML4 of at least one protection line MLL may include a zigzag pattern. For example, at least one protection line MLL includes a convex-concave embossing shape to increase a surface area compared to a straight pattern so that it is effective to absorb (attach) TMAH ions. For example, when moisture permeates along an end portion of the wiring line, the path is increased by the embossing structure or the concave-convex structure so that the moisture permeation into the display apparatus may be delayed.

The display apparatus according to the exemplary aspect of the present disclosure may be applicable to a mobile device, a video phone, a smart watch, a watch phone, a wearable apparatus, a foldable apparatus, a rollable apparatus, a bendable apparatus, a flexible apparatus, a curved apparatus, a sliding apparatus, a variable apparatus, a personal digital assistant, an electronic book, a portable multimedia player (PMP), a personal digital assistant (PDA), an MP3 player, a mobile medical apparatus, a desktop PC, a laptop PC, a netbook computer, a workstation, a navigation, a navigation for a vehicle, a display apparatus for a vehicle, an apparatus for a vehicle, a theatrical apparatus, a theatrical display apparatus, a television, a wallpaper device, a signage device, a game device, a notebook, a monitor, a camera, a camcorder, a consumer electronics device, and the like. Further, the display apparatus of the present disclosure may be also applied to an organic light emitting illumination apparatus or an inorganic light emitting illumination apparatus.

The exemplary aspects of the present disclosure may also be described as follow:

According to an aspect of the present disclosure, there is provided a display apparatus comprising a substrate including a non-active area including a bending area and a pad area and an active area, a gate driver disposed in the non-active area, a driving integrated circuit disposed in the pad area, a plurality of signal lines which is disposed in the bending area and connects the driving integrated circuit and the gate driver to each other and at least one protection line disposed at an end in a width direction of the bending area. One end of the at least one protection line is connected to the driving integrated circuit.

A lower voltage than that of the plurality of signal lines may be applied to the at least one protection line.

A negative (–) voltage may be applied to the at least one protection line.

The display apparatus may further comprise a first thin film transistor which is disposed in the active area and includes a first active layer, a first gate electrode, a first source electrode, and a first drain electrode, at least one insulating layer disposed on the first gate electrode and a second thin film transistor which is disposed on the at least one insulating layer and includes a second active layer, a second gate electrode, a second source electrode, and a second drain electrode.

The display apparatus may further comprise a first planarization layer disposed on the second source electrode and the second drain electrode and a connection electrode which is disposed on the first planarization layer and is connected to the second drain electrode. The plurality of signal lines may be disposed on the same layer as the connection electrode with the same material.

The display apparatus may further comprise a plurality of driving lines extending from the active area. The plurality of driving lines may be disposed on the same layer as the first gate electrode and the plurality of signal lines may be connected to the plurality of driving lines, respectively, through a contact hole.

The at least one protection line may be disposed on the same layer as the connection electrode with the same material.

The display apparatus may further comprise a first planarization layer disposed in the bending area on the substrate and an overcoat layer which is disposed in the bending area on the first planarization layer. The plurality of signal lines and the at least one protection line may be disposed between the substrate and the overcoat layer.

The at least one protection line may be disposed at an outer portion more than the plurality of signal lines in the bending area.

The at least one protection line may be not connected to a wiring line of the active area.

The display apparatus may further comprise a first planarization layer on the substrate. The at least one protection line may include a first wiring line and a second wiring line, and the second wiring line may be disposed between the substrate and the first planarization layer and the first wiring line may be disposed on the first planarization layer.

The first wiring line may transmit a signal of a lower voltage than that of the plurality of signal lines or the same voltage and the second wiring line may transmit a signal of a higher voltage than that of the plurality of signal lines or the same voltage.

The display apparatus may further comprise a second planarization layer on the first wiring line and an overcoat layer on the second planarization layer. The at least one protection line may further include a third wiring line, and the third wiring line may be disposed between the second planarization layer and the overcoat layer.

The first wiring line may transmit a signal of a negative (–) voltage and the second wiring line, and the third wiring line may transmit a signal of a positive (+) voltage.

The first wiring line may transmit a signal of a lower voltage than that of the plurality of signal lines and the second wiring line and the third wiring line may transmit a signal of a higher voltage than that of the plurality of signal lines.

At least a part of the at least one protection line may include a concave-convex structure.

The driving integrated circuit may further include an input pad and an output pad. The at least one protection line may include a first wiring line connected to the output pad and a fourth wiring line connected to the input pad and the first wiring line and the fourth wiring line may be separated at one end and are connected at the other end.

The display apparatus may further comprise a protection layer disposed on the second planarization layer and/or the overcoat layer.

The first planarization layer may enclose a side surface of the second wiring line, the second planarization layer may enclose a side surface of the first wiring line, and the overcoat layer may enclose a side surface of the third wiring line.

Two or more of the first wiring line, the second wiring line and the third wiring line may have the same material.

The first wiring line and the fourth wiring line may be located at the same layer.

According to an aspect of the present disclosure, there is provided a display apparatus, may comprising: a substrate including a non-active area including a bending area and a pad area and an active area; a gate driver disposed in the non-active area; a driving integrated circuit disposed in the pad area; a plurality of signal lines which is disposed in the bending area and connects the driving integrated circuit and the gate driver to each other; and at least one protection line disposed at an outside of signal lines in the bending area; wherein a voltage applied to the at least one protection line is lower than a voltage applied to the signal lines.

It will be apparent to those skilled in the art that various modifications and variations can be made in the display apparatus of the present disclosure without departing from the spirit or scope of the aspects of the present disclosure. Thus, it is intended that the present disclosure covers the modifications and variations of the aspects provided they come within the scope of the appended claims and their equivalents.

What is claimed is:

1. A display apparatus, comprising:
   a substrate including an active area and a non-active area including bending area;
   a plurality of transistors including a first transistor which is disposed on the substrate and includes a first active layer, a first source electrode connected to the first active layer, and a first drain electrode connected to the first active layer and a second transistor which is disposed on the substrate and includes a second active layer, a second source electrode connected to the second active layer, and a second drain electrode connected to the second active layer, at least one of the first active layer and the second active layer is formed of an oxide semiconductor;

a first connection electrode which is disposed on the plurality of transistors and is connected to a transistor including an active layer which is formed of the oxide semiconductor;

a first planarization layer disposed on the first connection electrode;

a second planarization layer disposed on the first planarization layer;

a second connection electrode disposed between the first planarization layer and the second planarization layer;

a first electrode disposed on the second planarization layer;

a light emitting layer disposed on the first electrode;

a second electrode disposed on the light emitting layer;

an encapsulation layer which is disposed on the second electrode and includes a first encapsulation layer which is formed of an inorganic material, a second encapsulation layer which is formed of an organic material and disposed on the first encapsulation layer, and a third encapsulation layer which is formed of an inorganic material and disposed on the second encapsulation layer; and a touch sensing layer disposed on the encapsulation layer.

2. The display apparatus according to claim 1, wherein a width of the bending area is different from a width of at least some part of an area excluding the bending area.

3. The display apparatus according to claim 2, wherein the width of the bending area is smaller than the width of at least some part of an area excluding the bending area.

4. The display apparatus according to claim 1, wherein the first active layer and the second active layer are disposed on different layers.

5. The display apparatus according to claim 1, further comprising:

an organic pattern which is disposed on the substrate in the bending area and includes a groove.

6. The display apparatus according to claim 5, wherein the organic pattern and the first planarization layer are formed of a same material.

7. The display apparatus according to claim 1, wherein the touch sensing layer includes:

a touch buffer film;

a bridge metal on the touch buffer film;

a touch interlayer insulating film; and a touch sensor metal on the touch interlayer insulating film.

8. The display apparatus according to claim 7, wherein the bridge metal and the touch sensor metal are connected through a contact hole of the touch interlayer insulating film.

9. The display apparatus according to claim 7, further comprising:

an organic material layer on the touch sensor metal.

10. The display apparatus according to claim 1, wherein the substrate further includes:

a first layer which is formed of an organic material;

a second layer which is disposed on the first layer and is formed of an inorganic material; and a third layer which is disposed on the second layer and is formed of an organic material.

11. The display apparatus according to claim 1, wherein the transistor including the active layer which is formed of the oxide semiconductor is a driving transistor.

12. The display apparatus according to claim 1, wherein the first connection electrode, the first source electrode, the first drain electrode, the second source electrode and the second drain electrode are formed of a same material.

13. The display apparatus according to claim 1, further comprising:

at least one insulating layer disposed between the second drain electrode, the second and the second active layer, wherein the second drain electrode and the second source electrode is connected to the second active layer through a contact hole of the at least one insulating layer, wherein the second active layer is formed of the oxide semiconductor.

14. The display apparatus according to claim 1, wherein the first connection electrode is integrally formed to be connected to the second drain electrode.

15. The display apparatus according to claim 1, wherein the second connection electrode is connected to the first connection electrode and the second drain electrode through a contact hole of the first planarization layer.

16. The display apparatus according to claim 15, wherein the second connection electrode connects the first electrode and the second drain electrode through the contact hole of the first planarization layer, wherein the second active layer is formed of the oxide semiconductor.

* * * * *